(12) United States Patent
Kuyel

(10) Patent No.: US 10,970,442 B1
(45) Date of Patent: Apr. 6, 2021

(54) METHOD OF DEBUGGING HARDWARE AND FIRMWARE OF DATA STORAGE

(71) Applicant: SK hynix Inc., Icheon-Si (KR)

(72) Inventor: Andrey Kuyel, San Jose, CA (US)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/662,374

(22) Filed: Oct. 24, 2019

(51) Int. Cl.
*G06F 30/33* (2020.01)
*G06F 30/30* (2020.01)
*G06F 30/00* (2020.01)
*G06F 30/34* (2020.01)

(52) U.S. Cl.
CPC .............. *G06F 30/33* (2020.01); *G06F 30/00* (2020.01); *G06F 30/30* (2020.01); *G06F 30/34* (2020.01)

(58) Field of Classification Search
CPC .... G06F 30/327; G06F 30/3323; G06F 30/30; G06F 30/33; G06F 30/396; G06F 2111/00; G01R 31/318541; G01R 31/31858
See application file for complete search history.

(56) References Cited

U.S. PATENT DOCUMENTS

| | | | | |
|---|---|---|---|---|
| 5,546,562 A * | 8/1996 | Patel | ....................... | G06F 30/33 703/14 |
| 6,009,256 A * | 12/1999 | Tseng | .................... | G06F 30/331 703/13 |
| 6,026,230 A * | 2/2000 | Lin | ......................... | G06F 30/33 703/13 |
| 6,134,516 A * | 10/2000 | Wang | ..................... | G06F 30/331 703/27 |
| 6,321,366 B1 * | 11/2001 | Tseng | ....................... | G06F 30/33 326/94 |
| 6,389,379 B1 * | 5/2002 | Lin | ........................ | G06F 30/331 703/14 |
| 6,421,251 B1 * | 7/2002 | Lin | ........................ | G06F 30/331 361/788 |
| 6,754,763 B2 * | 6/2004 | Lin | ...................... | G06F 15/7864 710/317 |
| 7,480,606 B2 * | 1/2009 | Tseng | ...................... | G06F 30/33 703/14 |
| 7,512,728 B2 * | 3/2009 | Tseng | ................... | G06F 13/4291 710/100 |
| 8,244,512 B1 * | 8/2012 | Tseng | ..................... | G06F 30/331 703/14 |
| 8,786,613 B2 * | 7/2014 | Millman | ................. | G06T 13/20 345/473 |
| 8,832,619 B2 * | 9/2014 | Kundu | .................. | G06F 30/367 716/110 |
| 8,863,148 B1 * | 10/2014 | Chow | ................... | G06F 11/362 719/313 |

(Continued)

*Primary Examiner* — Helen Rossoshek
(74) *Attorney, Agent, or Firm* — Perkins Coie LLP

(57) ABSTRACT

Disclosed is a method of hardware and firmware debugging. The method includes coupling an interface sniffer to an interface of the hardware component on which firmware is running such that the interface sniffer captures a transaction on the interface that is associated with the hardware component, coupling, to the interface sniffer, a simulator including a reference model to receive the captured transaction by the simulator such that the captured transaction affects the reference model, and causing the internal state of the hardware component to be reproduced in the simulator based on the reference model affected by the captured transaction.

20 Claims, 17 Drawing Sheets

(56) References Cited

U.S. PATENT DOCUMENTS

| | | | | |
|---|---|---|---|---|
| 8,990,133 | B1* | 3/2015 | Ponulak | G06N 3/049 |
| | | | | 706/25 |
| 8,997,034 | B2* | 3/2015 | Chang | G06F 30/398 |
| | | | | 716/136 |
| 9,229,841 | B2 | 1/2016 | Zilbershtein et al. | |
| 9,501,591 | B2* | 11/2016 | Authement | G06F 30/331 |
| 9,569,179 | B1* | 2/2017 | Kachmar | G06F 8/34 |
| 9,652,260 | B2* | 5/2017 | Ahmed | G06F 9/44505 |
| 10,067,033 | B2* | 9/2018 | Blom | G01M 15/08 |
| 2005/0229170 | A1* | 10/2005 | Bellantoni | G06F 30/33 |
| | | | | 717/165 |
| 2011/0307233 | A1* | 12/2011 | Tseng | G06F 30/331 |
| | | | | 703/14 |
| 2011/0307688 | A1* | 12/2011 | Nurvitadhi | G06F 30/30 |
| | | | | 712/219 |
| 2015/0302133 | A1* | 10/2015 | Ikram | G06F 30/3323 |
| | | | | 716/111 |
| 2017/0315523 | A1* | 11/2017 | Cross | G05B 17/02 |
| 2018/0120916 | A1* | 5/2018 | Lin | G06F 1/324 |

\* cited by examiner

METHOD OF DEBUGGING HARDWARE AND FIRMWARE OF DATA STORAGE

TECHNICAL FIELD

This patent document relates to semiconductor memories and data storages including the semiconductor memories.

BACKGROUND

Semiconductor-based data storage devices such as solid state drives (SSDs) are actively being used in computing systems, due to their improved performance and decreased mechanical reliability compared to hard disk drives (HDDs). A data storage device includes a controller and other hardware components in communication with the computing system via an interface protocol, and data storage elements in the SSD are connected to the controller and hardware components via a device interface. In addition, a variety of software components, operating systems, and firmware may be integrated into the data storage device.

SUMMARY

Embodiments of the disclosed technology relate to methods and systems that, among other features and benefits, allow speeding up SoC debug on FPGA multifold, without a significant increase in the required FPGA capacity.

In an embodiment of the disclosed technology, a method for reproducing a hardware component using an internal state in the simulation environment includes coupling an interface sniffer to an interface of the hardware component on which firmware is running such that the interface sniffer captures a transaction on the interface that is associated with the hardware component, coupling, to the interface sniffer, a simulator including a reference model to receive the captured transaction by the simulator such that the captured transaction affects the reference model, and causing the internal state of the hardware component to be reproduced in the simulator based on the reference model affected by the captured transaction.

In another embodiment of the disclosed technology, a system includes an interface sniffer in communication with an interface of a hardware component to capture a transaction on the interface, a processor in communication with the interface sniffer to produce a simulator specific transaction based on the captured transaction, and a simulator including a reference model in communication with the processor and configured to convert the simulator specific transaction into a model input transaction, allow the model input transaction to affect the reference model, and produce a model output transaction.

DETAILED DESCRIPTION

Figure 1:
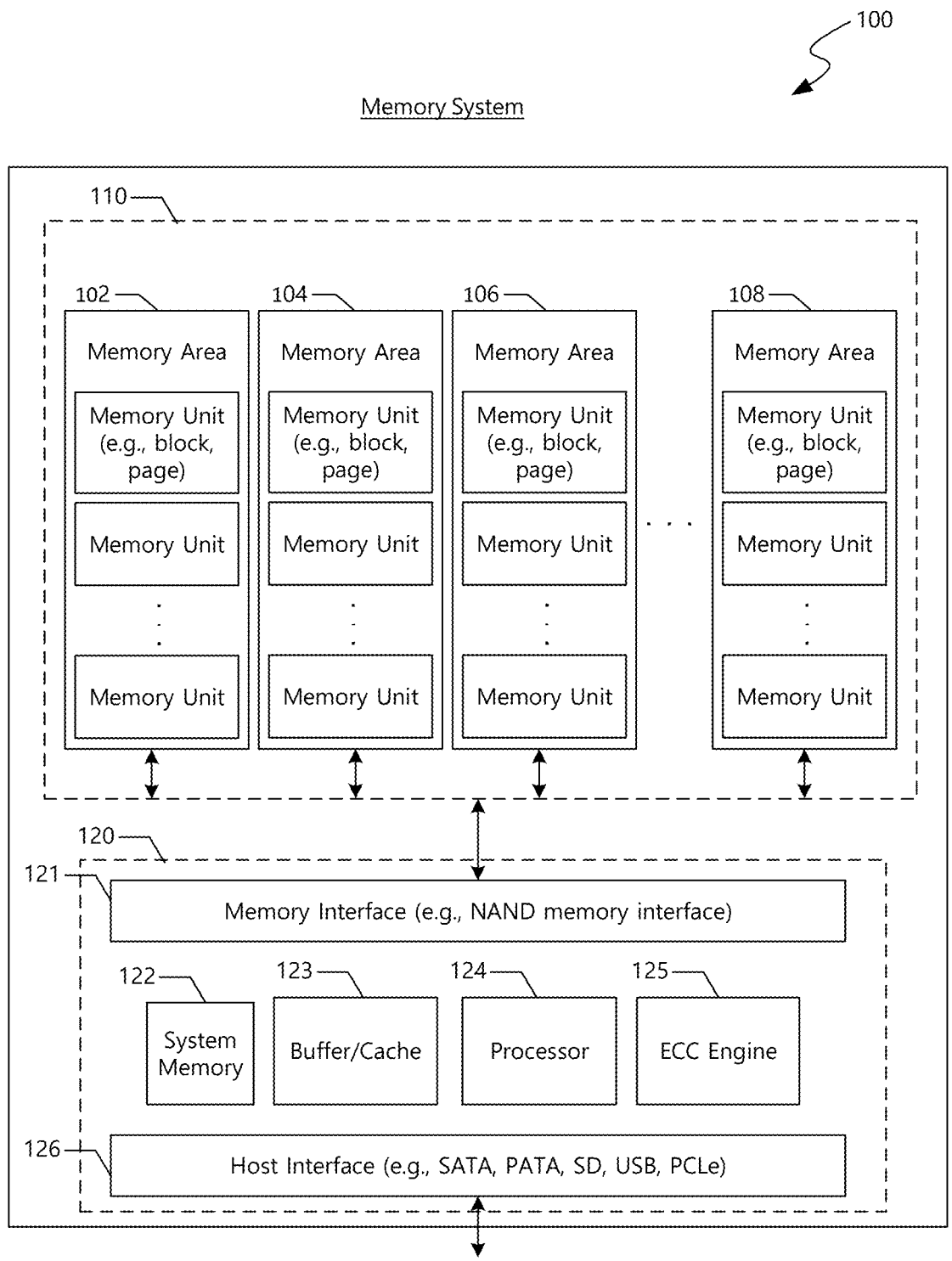
FIG. 1 illustrates an example of a memory system implemented based on some embodiments of the disclosed technology.

FIG. 1 illustrates an example of a memory system 100 implemented based on some embodiments of the disclosed technology. The memory system 100 includes a memory module 110 that can be used to store information for use by other electronic devices or systems. The memory system 100 can be incorporated (e.g., located on a circuit board) in other electronic devices and systems. Alternatively, the memory system 100 can be implemented as an external storage device such as a USB flash drive and a solid-state drive (SSD).

The memory module 110 included in the memory system 100 can include memory areas (e.g., memory arrays) 102, 104, 106, and 108. Each of the memory areas 102, 104, 106, and 108 can be included in a single memory die or in multiple memory dice. The memory die can be included in an integrated circuit (IC) chip.

Each of the memory areas 102, 104, 106, and 108 includes a plurality of memory cells. Read, program, or erase operations can be performed on a memory unit basis. Thus, each memory unit can include a predetermined number of memory cells. The memory cells in a memory area 102, 104, 106, or 108 can be included in a single memory die or in multiple memory dice.

The memory cells in each of memory areas 102, 104, 106, and 108 can be arranged in rows and columns in the memory units. Each of the memory units can be a physical unit. For example, a group of a plurality of memory cells can form a memory unit. Each of the memory units can also be a logical unit. For example, the memory unit can be a bank, block, or page that can be identified by a unique address such as bank address, block address, and page basis address. During a read or write operation, the unique address associated with a particular memory unit can be used to access that particular memory unit. Based on the unique address, information can be written to or retrieved from one or more memory cells in that particular memory unit.

The memory cells in the memory areas 102, 104, 106, and 108 can include non-volatile memory cells. Examples of non-volatile memory cells include flash memory cells, phase change memory (PRAM) cells, magnetoresistive random-access memory (MRAM) cells, or other types of non-volatile memory cells. In an example implementation where the memory cells are configured as NAND flash memory cells, the read or write operation can be performed on a page basis. However, an erase operation in a NAND flash memory is performed on a block basis.

Each of the non-volatile memory cells can be configured as a single-level cell (SLC) or multiple-level memory cell. A single-level cell can store one bit of information per cell. A multiple-level memory cell can store more than one bit of information per cell. For example, each of the memory cells in the memory areas 102, 104, 106, and 108 can be configured as a multi-level cell (MLC) to store two bits of information per cell, a triple-level cell (TLC) to store three bits of information per cell, or a quad-level cells (QLC) to store four bits of information per cell. In another example, each of the memory cells in memory area 111 can be configured to store at least one bit of information (e.g., one bit of information or multiple bits of information), and each of the memory cells in memory area 112 can be configured to store more than one bit of information.

As shown in FIG. 1, the memory system 100 includes a controller module 120. The controller module 120 includes a memory interface 121 to communicate with the memory module 110, a host interface 126 with communicate with a host (not shown), a processor 124 to executes firmware-level code, and caches and memories 122 and 123 to temporarily or persistently store executable firmware/instructions and associated information. In some implementations, the controller unit 120 can include an error correction engine 125 to perform error correction operation on information stored in the memory module 110. Error correction engine 122 can be configured to detect/correct single bit error or multiple bit errors. In another implementation, error correction engine 125 can be located in the memory module 110.

The host can be a device or a system that includes one or more processors that operate to retrieve data from the memory system 100 or store or write data into the memory system 100. In some implementations, examples of the host can include a personal computer (PC), a portable digital device, a digital camera, a digital multimedia player, a television, and a wireless communication device.

In some implementations, the controller module 120 can also include a host interface 126 to communicate with the host. Host interface 126 can include components that comply with at least one of host interface specifications, including but not limited to, Serial Advanced Technology Attachment (SATA), Serial Attached Small Computer System Interface (SAS) specification, Peripheral Component Interconnect Express (PCIe).

Figure 2:
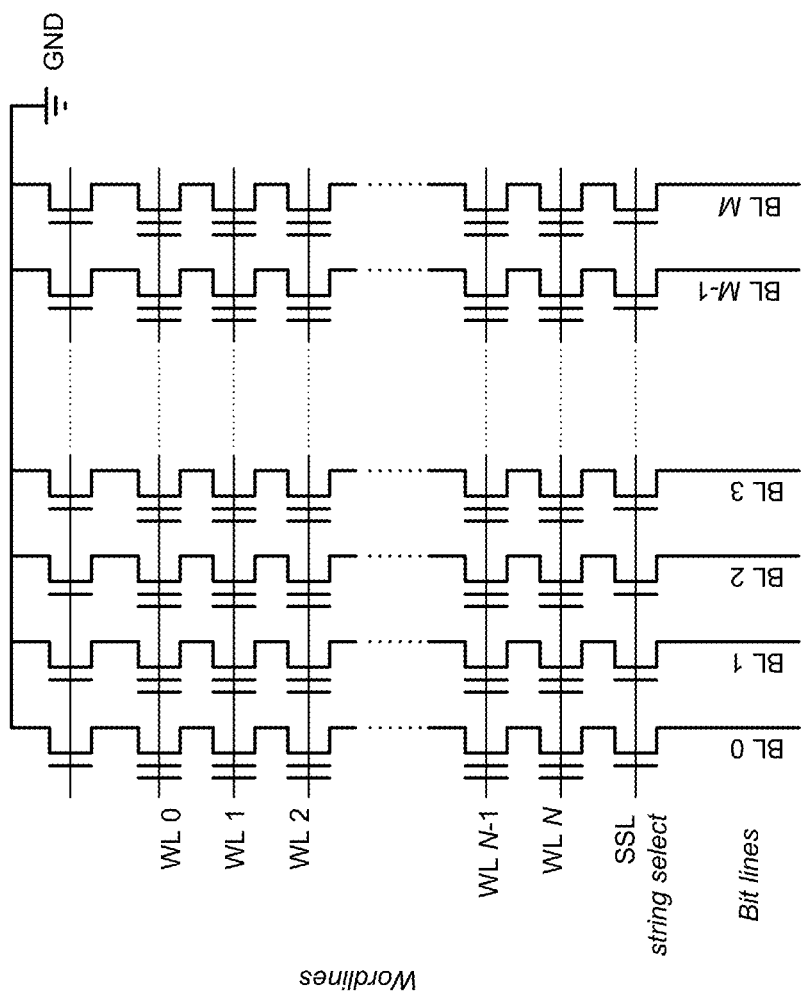
FIG. 2 illustrates an example of a memory cell array implemented based on some embodiments of the disclosed technology.

FIG. 2 illustrates an example of a memory cell array implemented based on some embodiments of the disclosed technology.

In some implementations, the memory cell array can include NAND flash memory array that is partitioned into many blocks, and each block contains a certain number of pages. Each block includes a plurality of memory cell strings, and each memory cell string includes a plurality of memory cells.

In some implementations where the memory cell array is NAND flash memory array, read and write (program) operations are performed on a page basis, and erase operations are performed on a block basis. All the memory cells within the same block must be erased at the same time before performing a program operation on any page included in the block. In an implementation, NAND flash memories may use an even/odd bit-line structure. In another implementation, NAND flash memories may use an all-bit-line structure. In the even/odd bit-line structure, even and odd bit-lines are interleaved along each word-line and are alternatively accessed so that each pair of even and odd bit-lines can share peripheral circuits such as page buffers. In all-bit-line structure, all the bit-lines are accessed at the same time.

A number of hardware bugs, which are missed during the design verification stage of SSD SoC design process, are revealed while running SSD firmware (FW) on field programmable gate arrays (FPGA) SSD prototype. When a hardware bug is suspected, it may be difficult and time-consuming to find the issue that has led to the incorrect hardware or firmware behavior. The reasons are as follows. First, the usage of the in-circuit logic analyzer as one of the conventional debug methods implies that the engineer who performs debugging is constrained by the small amount of FPGA internal memory while picking signals and choosing a timeframe to be dumped. Another drawback of the method is the necessity to spend significant time recompiling the entire design every time when an engineer changes the set of signals to be dumped or other dump parameters. Secondly, it might be difficult to distinguish between hardware (HW) and firmware (FW) nature of the failure's root cause without a log containing information about pre- and post-failure HW states, bus transaction, etc. Thirdly, to conduct an efficient failure debug, it is preferable to have some history of the changes of the system states over time. For example, state change history would facilitate identifying which event triggers a transition to the next state. In general, SoC is not designed to internally log large amount of the debug information and the limited external debug port bandwidth makes it difficult, if not impossible, to output all of the saved debug information before it is overwritten with new data.

Since the debugging an SoC on FPGA is an iterative and time-consuming process, a larger portion of the FPGA capacity can be allocated for debugging purposes to fit more captured signals. However, such an increased usage of FPGA capacity reduces the available space for implementation of actual circuitry, which increases the cost and reduces the efficiency of implementation; notably, in some applications, such an increase may not be possible. The system and method implemented based on the embodiments of the disclosed technology, however, allow speeding up SoC debug on FPGA multifold, without a significant increase in the required FPGA capacity.

Figure 3:
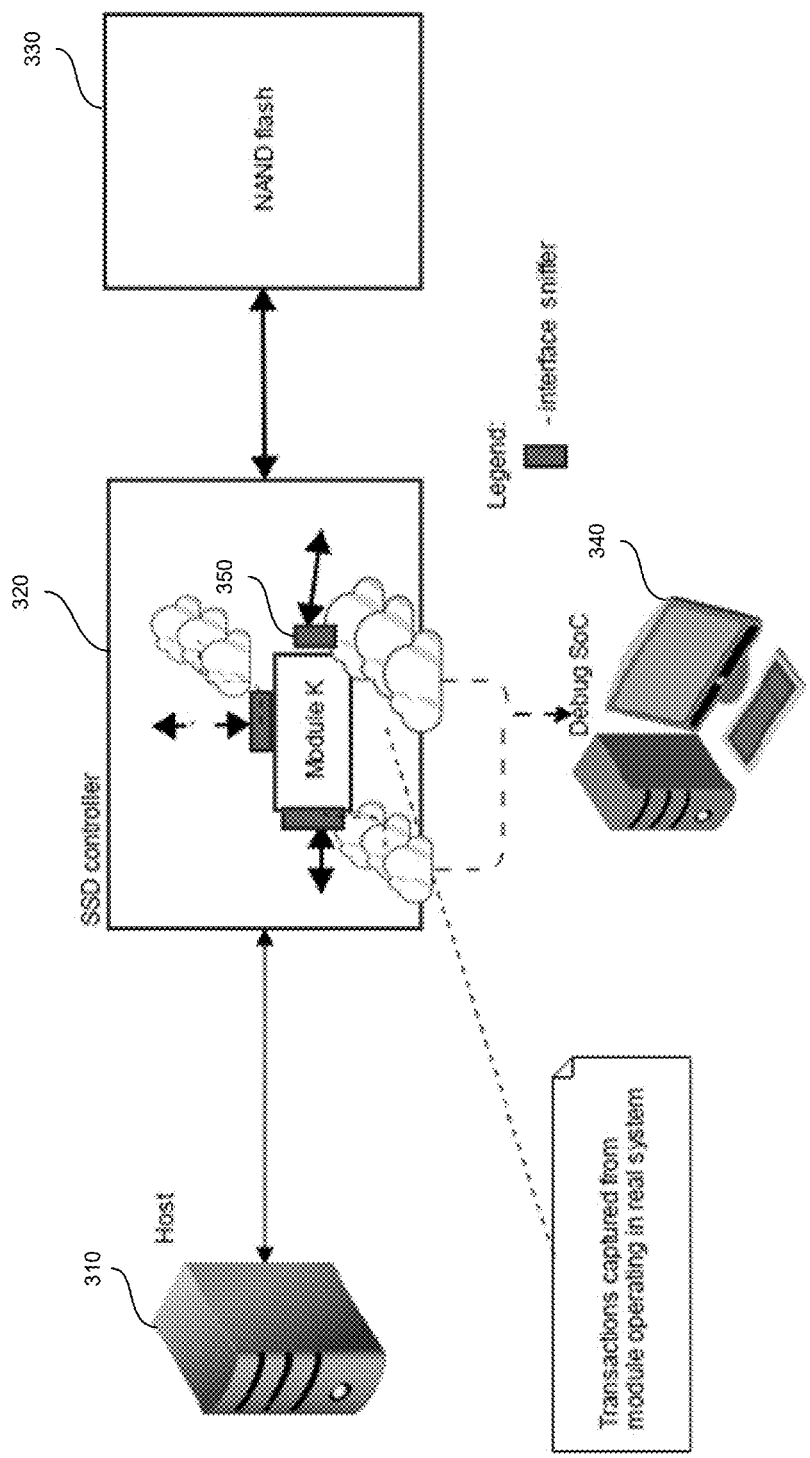
FIG. 3 illustrates an example of a debug flow with interface sniffers based on some embodiments of the disclosed technology.

FIG. 3 illustrates an example of a debug flow with interface sniffers based on some embodiments of the disclosed technology. In some implementations, a dedicated software attaches interface sniffers to the module under debug. The interface sniffers track the changes in device signal. In some implementations, the interface sniffer may include software or hardware or a combination of software and hardware that can monitor or sniff the data flowing over buses, interfaces, and channels in real time. For example, the interface sniffers can capture the data flowing over the buses, interfaces, and channels without altering it. As shown in FIG. 3, the interface sniffers 350 may be configured to capture transactions between a host 310 and an SSD controller 320, between the SSD controller 320 and NAND flash memory devices 330, and between the SSD controller 320 and other hardware components (not shown).

Figure 4:
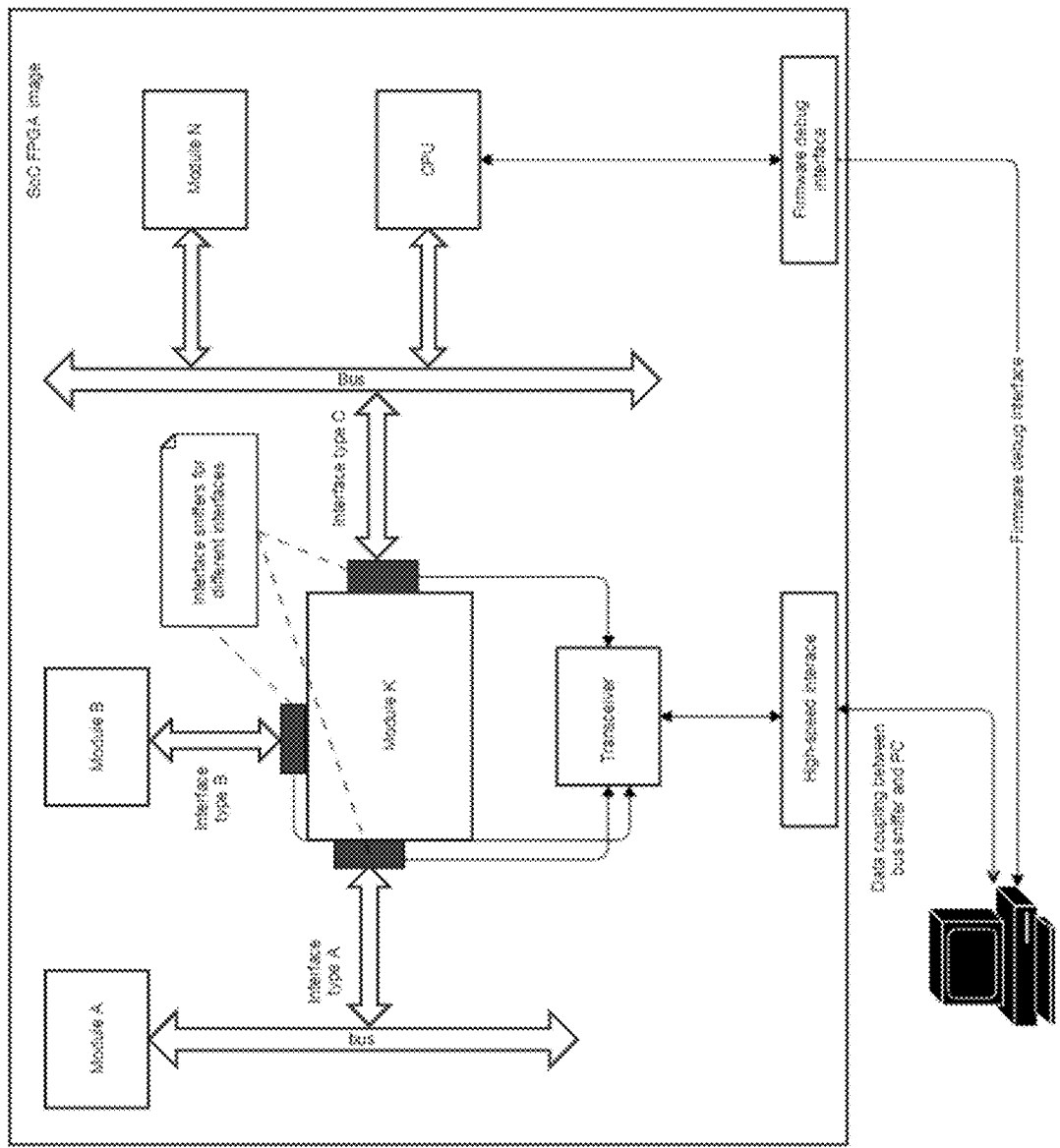
FIG. 4 illustrates an example interface for connection of sniffers to one of system-on-chip (SoC) modules based on some embodiments of the disclosed technology.

FIG. 4 illustrates an example interface for connection of sniffers to one of SoC modules based on some embodiments of the disclosed technology. In the SoC FPGA, modules (e.g., Module A, Module B, Module K, Module N) are connected to each other via interfaces, and the interfaces are connected to each other via buses. In some implementations, each interface has an interface sniffer connection to monitor transactions that take place at the interface. When an interface sniffer detects a transaction on the interface, it captures the transaction and forwards it to the computer for further processing.

The internal states and expected outputs of a hardware component under debug (hardware component with interface sniffers attached) are reproduced in the simulation environment. In some implementations, the method of debugging the hardware component can include monitoring and collecting transactions on the interface. The method can also include comparing hardware component outputs to reference model outputs. In one example, transactions (e.g., communication between the hardware component and other devices) captured by the interface sniffer affect a reference model in the simulation environment, resulting in affecting the outputs from the reference model. In one example, the transactions captured by the interface sniffer change internal states of the reference model, and the changes in the internal states lead to the changes in the outputs from the reference model.

The interface sniffer is a hardware device/module that detects/collects transaction of corresponding interface protocol, and forwards collected transactions to a transceiver. The transceiver forwards the collected transactions to a computer for processing and analysis. As shown in the drawing, each interface sniffer can be configured to support each type of interface (e.g., interface type A, B, and C) depending on its bus protocol.

When the interface sniffer detects a transaction on the interface, it captures the transaction and forwards it to the computer for further processing. In some implementations, each type (e.g., bus protocol) of interface can have its dedicated interface sniffer which supports the corresponding interface protocol.

The transceiver is a hardware module that transfers transaction received from multiple interface sniffers to a computer via a high-speed communication channel. In some implementations, the transceiver is capable to preprocess (for example pack and compress) collected transactions to achieve more efficient communication channel utilization.

The transceiver is coupled with the computer and the simulation environment through a high-speed communication channel. The optimal utilization of the high-speed communication channel guarantees that transactions are transferred from the transceiver to the computer with high channel bandwidth utilization and that transferred transactions are intact. The high-speed communication channel is configured to have enough bandwidth to accommodate all the captured transactions.

In some implementations, a system with a firmware debug interface may include hardware components, microprocessor, and firmware configured to run on the microprocessor. The microprocessor-based system has a firmware debug interface that allows determining/modifying microprocessor state and tracing program flow around programmable events. Microprocessor program flow around programmable events and transactions collected from the hardware component under debug are synchronized/matched with each other to provide a more convenient way for an engineer to analyze the internal state of the hardware component.

Figure 5:
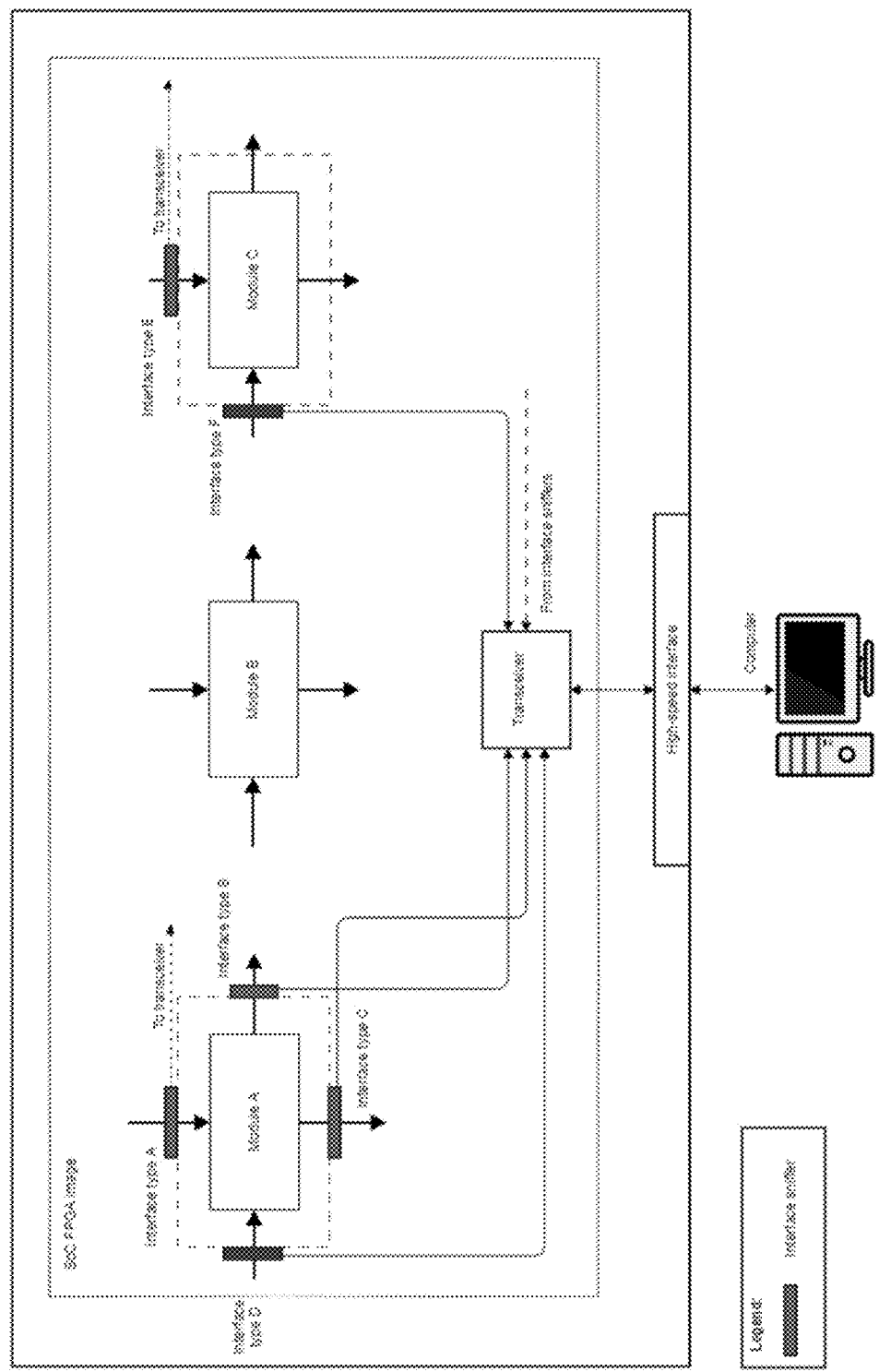
FIG. 5 illustrates an example interface for connection of sniffers to several SoC modules based on some embodiments of the disclosed technology.

FIG. 5 illustrates an example interface for connection of sniffers to several SoC modules based on some embodiments of the disclosed technology. Each interface sniffer may capture transactions at a corresponding interface, and a transceiver in communication with the interface sniffer may collect the transactions to transmit them to the computer. In the computer, the received transactions are processed by the software module and forwarded to a reference model simulation environment.

The disclosed technology may be embodied as a method, system, or computer program product. Accordingly, the embodiments of the disclosed technology may take the form of hardware, software, or a combination of hardware and software.

In some implementations, a dedicated software generates interface sniffers, which listen to the selected interfaces, instantiate them, and add the corresponding communication and transaction capture logic to the original SoC design. The modified SoC design is then compiled and uploaded to a dedicated FPGA board.

Interface sniffers, transaction transceiver and corresponding data path logic between these components are generated by software tool based on a predetermined description file. The software tool instantiates and connects all listed components into the original system. System design is modified in order to add interface sniffer, transceiver and data path logic. Since those added components do not have any effect on the original design functionality, the modified design operates in the same way as prior to the insertion of components. In other words, although new components (e.g., interface sniffer, transceiver, and data path logic) are added to the original design they don't modify the internal state of original design but rather extend it.

In the context of this patent document, the word "transaction" is used to indicate exchanges of interface signals. In one example, the transaction includes aggregated, decoded interface signals that are exchanged over time and represent some event in the corresponding protocol. In some implementations, a transaction may consist of a plurality of quadruple words (qwords). In one example, the qword is a unit of data that is four times the size of a word. The number of qwords per transaction depends on the data payload size.

Transactions collected by the interface sniffer for different bus protocols may have the same data structure. In some implementations, the transaction captured by the interface sniffer may contain the following fields: destination address, data payload, and status. Examples of transaction formats are described in Table 1 and Table 2 below. The format of transactions listed below may be reused for interfaces sniffer transactions and for simulator-specific transactions.

TABLE 1

Transaction Format

| QWORD | Bytes 15:12 | 11:8 | 7:4 | 3:0 |
|---|---|---|---|---|
| 0 | originator sniffer id | transaction-id | | transaction type |
| 1 | reserved | data payload size in bytes | transaction timestamp | |
| 2 | transaction mode | transaction address | | |
| 3 | data payload | | | |
| ... | data payload | | | |
| n-1 | data payload | | | |
| n | CRC | | | |

TABLE 2

Transaction Field Description

| QWORD index | Bytes index in qword | Field name | Description |
|---|---|---|---|
| 0 | 3:0 | transaction type | transaction-type uniquely identifies the bus protocol to which currently transaction belongs. |
| 0 | 11:4 | transaction-id | unique transaction identifier. |
| 0 | 15:12 | originator sniffer id | sniffer ID originating the current transaction. |
| 1 | 7:0 | transaction timestamp | a number of clocks rising edges since lates reset. During overflow, timestamp value reset to zero. timestamp is relative to interface sniffer interface clock. |
| 1 | 11:8 | data payload size in bytes | size of the transaction data payload in bytes. |
| 2 | 11:0 | transaction address | 48-bit width transaction address. if address not used for current bus protocol all bits set to 0x0. |
| 2 | 15:12 | transaction mode | transaction mode: bit 48 - if 1 write transaction else read. bit 51:49 - transaction response. 0 - ok, 1 - decoding error, 2 - slave error. Other bits are reserved. |
| [3, n-1] | 15:0 | data payload | data transferred during the transaction. |
| n | 15:0 | CRC | Error-detecting code to detect accidental changes to raw data. CRC calculated on qwords [0, n-1]. |

Figure 6:
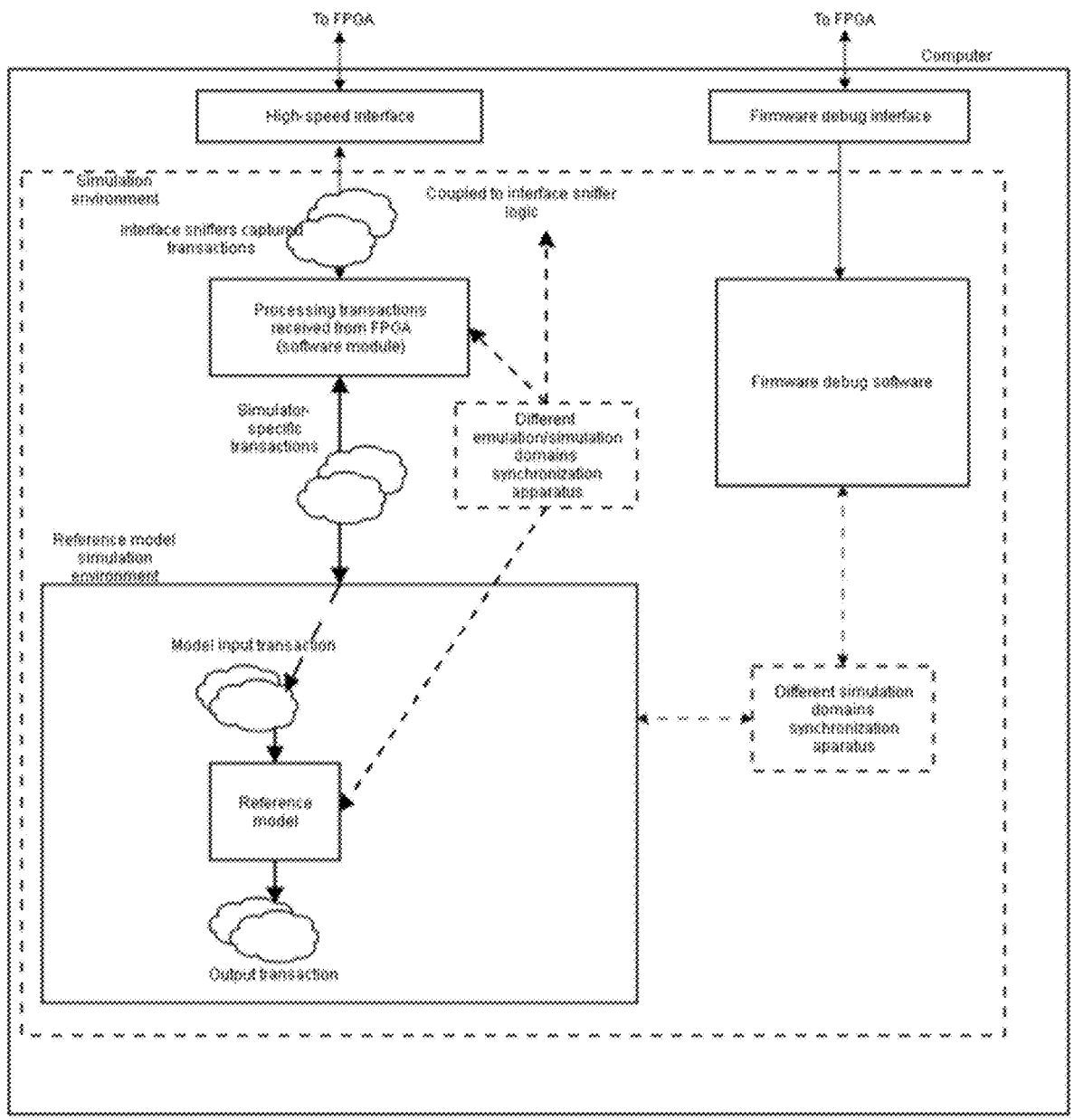
FIG. 6 illustrates an example of computer system to debug SoC hardware/firmware based on some embodiments of the disclosed technology.
Figure 7:
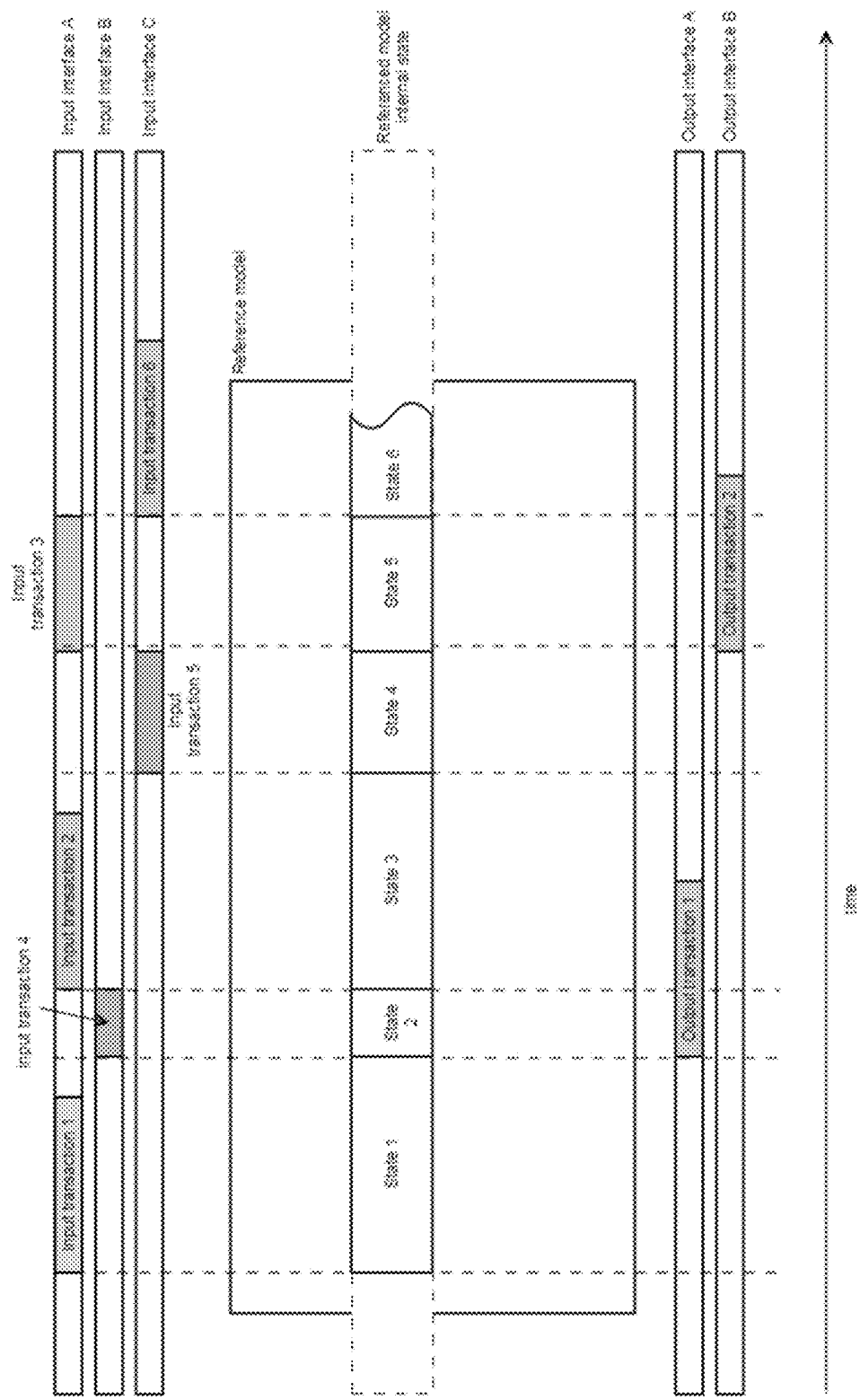
FIG. 7 illustrates an example of reference model internal state and outputs reproduced from the input transactions based on some embodiments of the disclosed technology.

FIG. 6 illustrates an example of computer system to debug SoC hardware/firmware components based on some embodiments of the disclosed technology. FIG. 7 illustrates an example of reference model internal state and outputs reproduced from the input transactions based on some embodiments of the disclosed technology.

As shown in FIG. 6, the computer may include a simulation environment that includes a software module configured to process transactions received from FPGA. The received transactions processed by the software module are forwarded to a reference model simulation environment. The reference model simulation environment is one of the components of the simulation environment depicted in FIG. 6. The reference model simulation environment combines multiple components into one single powerful tool. In the reference model simulation environment, hardware component under debug internal state is reproduced, examined, and checked. In some embodiments of the disclosed technology, the reference model simulation environment includes at least one of the reference model, transactions comparator, simulator, coverage collector, or transaction logger. The reference model simulation environment may also include a reference model. In the reference model simulation environment, the transaction from the previous step (simulator-specific transaction) is converted and fed to an input of the reference model (model input transaction). Reference models are high-level descriptions of design and are used to predict operations results of the design under test in the simulation.

The simulation environment may also include a synchronization apparatus that is coupled to an interface sniffer logic to synchronize different emulation/simulation domains. For example, the synchronization apparatus may be coupled to the interface sniffer logic, the software module, and the reference model to synchronize these different domains. In some implementations, the simulation environment may also include firmware debug software in communication with the FPGA via a firmware debug interface. The firmware debug software may be used to determine/modify microprocessor state and to trace program flow associated with programmable events. Such microprocessor program flow and the transactions collected by the software module are synchronized with each other to be used for analyzing simulation results. The simulation environment may also include another synchronization apparatus to synchronize firmware debug software domain with the reference model domain. In one example, this synchronization apparatus can be used to synchronize simulator-specific transactions, input transactions of the reference model (model input transactions), and output transactions of the reference model.

In some embodiments of the disclosed technology, the simulation environment may be implemented in a computer configured to include at least one of a high-speed interface, a transceiver transaction adapter, or a reference model simulation environment.

In some embodiments of the disclosed technology, the simulation environment may include a high-speed interface for duplex communication between the simulation environment (e.g., transceiver transaction adapter) and an interface sniffer transceiver.

In some embodiments of the disclosed technology, the simulation environment may include a transceiver transaction adapter to convert transactions received from the interface sniffer transceiver into a format that is supported by the simulator. The converted transaction is passed to the simulator by an invocation of dedicated application programming interface functions. In the case of hardware description language (HDL) simulator, a direct programming interface (DPI) is used. In one example, an interface sniffer transaction is mapped directly to a simulator transaction format. In other words, interface sniffers transaction format is reused for simulator-specific transactions (See Table 1 and Table 2 for transactions format).

In some embodiments of the disclosed technology, the reference model simulation environment may include a transaction comparator, a simulator, a coverage collector, and a transaction logger.

In some embodiments of the disclosed technology, the simulation environment indicates an environment in which the internal state of the hardware component under debug is reproduced, examined, and checked. In one example, the reference model simulation environment includes at least one of the reference model, transactions comparator, coverage collector, or transaction logger. The simulator based on some embodiments of the disclosed technology is implemented to support all the features required by the reference model simulation environment. Examples of the simulator can include the HDL simulator, which includes software packages that compile and simulate expressions written in one of the hardware description languages. For example, the HDL simulator in conjunction with hardware components under debug in the universal verification methodology (UVM) environment represents a reference model simulation environment.

In some embodiments of the disclosed technology, the reference model simulation environment may include a transaction comparator to compare two streams of data objects. These transactions may either be classes or built-in types. To be successfully compared, the two streams of data are in the same order. In one example, there are no assumptions made about the relative timing of the two streams of data.

In some embodiments of the disclosed technology, the reference model simulation environment may include a coverage collector to measure the degree to which HDL source codes of the hardware component is executed when a particular stimulus is applied. A hardware component with high coverage, measured as a percentage, executes more HDL source codes during testing than a hardware component with low coverage, which suggests that a HDL component with high coverage has a lower chance of containing undetected bugs compared to an HDL component with low coverage. Many different metrics can be used to calculate coverage, including the percentage of satisfied branch conditions and the percentage of HDL statements called during execution of a test suite.

In some embodiments of the disclosed technology, the reference model simulation environment may include a transaction logger to record and display a history of states changes and actions executed in the system in a human-readable format. The transaction may be stored and displayed in waveform format. A waveform view allows an integrated circuit (IC) designer to observe the signal transitions over time and the relation of those signals with other signals in an IC design.

In a simulator implemented based on some embodiments of the disclosed technology, transactions are fed to a reference model and the components (coverage collector, transaction loggers, etc.) constituting the reference model simulation environment. When the HDL simulator, the UVM environment, and a register-transfer level (RTL) model are used in the disclosed system, the complete internal state of the hardware component under debug is reproduced in the simulation environment.

Input transactions applied to the reference model can alter the internal state of the reference model and produce output transactions. Hardware component under debug output transactions captured by the interface sniffer and reference model output transactions are passed to the corresponding comparators. When a mismatch between the reference model output transaction and collected hardware component transaction is detected, a corresponding message is displayed.

In some embodiments of the disclosed technology, the simulation environment may include an apparatus for synchronization of different emulation/simulation domains. In one example, the apparatus is used to synchronize hardware component input transactions, hardware component output transactions, and reference model output transactions. This component of the simulation environment matches hardware component input transactions, hardware component output transaction, and reference model output transactions to bring them to a single timeline.

When the system with hardware component under debug includes a microprocessor, a dedicated firmware debug tool is used to trace program flow around programmable events. By means of the apparatus for synchronization of different emulation/simulation domains, the program flow can match input and output transactions of the reference model. This allows for examining internal states of hardware component such as microprocessor states.

In some embodiments of the disclosed technology, the reference model may indicate a device that is designed to produce, responsive to the same input signals, the same output signals as the hardware component under debug. In one example, the reference model can be implemented based on the implementation of the hardware component under debug that has already been verified to meet the given specifications/standards/requirements. The reference model, which produces the output transactions responsive to the input transactions, may also reproduce the internal state of the component under debug. For example, if an HDL RTL model that has been used for producing a particular hardware component is reused as a reference model of that particular hardware component in the simulation environment, it is possible to reproduce the internal state of the hardware component under debug. The RTL reference model can fully reproduce the corresponding hardware component internal states and outputs. Another example of a reference model is a high-level reference model of the hardware component. The high-level reference model has a behavioral implementation of a hardware component that does not exactly match the internal logic of the hardware component, and therefore the high-level reference model reproduces the same outputs of the hardware component and partially reproduces the internal states of the hardware component from the corresponding input transactions.

As shown in FIG. 7, the internal state of the model is reproduced in the simulation environment from the input transactions affecting the model. The transactions affecting the model are the genuine stimuli captured in a real operating SSD system including a host device, an SSD controller (complex firmware and hardware), and a NAND flash module (see FIG. 3).

One of the standalone block-level verification challenges is to create an input stimulus that correlates as much as possible with the real data applied to the device under test. In most cases, a synthetically created stimulus in block-level verification does not exactly match the stimulus in a real operating SSD system. Therefore, some of the design bugs are skipped during block-level verification. Unlike a synthetic stimulus from block-level verification, the method of debugging implemented based on some embodiments of the disclosed technology allows testing and debugging the module under a real captured stimulus.

Thus, in the simulation environment, the computer can access the internal state of the SoC component being debugged. The required accuracy of the reference model depends on the level of details needed for debugging. If, for example, a firmware bug is suspected, the reference model accuracy may be more relaxed than in case when a hardware bug is suspected. The described system also allows examining firmware internal state and synchronizing it with the corresponding state of the SoC component reference model in the simulation environment. Synchronization between the device under debug internal state and the corresponding reference model state achieved by the method and apparatus is able to synchronize internal states of different emulation/simulation domains.

The accuracy of the models, the type of the simulation environment, and the firmware debug tools used in the described system determine possible application of the invention. For example, if a hardware description language (HDL) simulator is used as a simulation environment, both the register-transfer level (RTL) model and the higher level model used for block-level verification in the universal verification methodology (UVM) environment can be used as a device under debug reference models. The debugging method implemented based on some embodiments of the disclosed technology allows using different simulation environments, for example, MATLAB or any other application-specific simulation environment.

In an embodiment of the disclosed technology, a dedicated software generates interface sniffers, which listen to the selected interfaces and instantiate them; the dedicated software also adds the corresponding communication and transactions capture logic to the original SoC design (see, e.g., FIGS. 4 and 5). The modified SoC design is then compiled and uploaded to a dedicated FPGA board. The FPGA board is equipped with a high-speed communication interface to transfer the captured transaction (by interface sniffers) to a remote computer. When a transaction is detected on the signals monitored by the interface sniffer, it is captured and passed to the transceiver module. The transceiver transmits the captured transaction via a high-speed communication channel to the computer. The transaction received on the computer is processed by a dedicated software module. During the processing, the transaction is converted into a format supported by the reference model simulation environment. The converted transactions are passed to the reference model simulation environment. In the reference model simulation environment, the transactions are routed to the destination reference model input interface. By affecting the reference model with the input stimulus, its internal state is reproduced (see, e.g., FIG. 7).

In another embodiment of the disclosed technology, the outputs of the SoC component under debug can be captured and compared to the outputs expected by the reference model. Such an approach allows automatically detecting data comparison mismatches between the reference model and the device under debug.

The system implemented based on some embodiments of the disclosed technology allows for firmware-hardware co-debug. The firmware debugger tool is synchronized with the hardware simulation environment by method and apparatus capable of synchronizing the internal states of different simulation domains. The synchronization between all system components is achieved during the simulation halt time. The synchronization between different system domains is a time-consuming process. Until the synchronization is finished, the simulation environment state is not valid.

Some embodiments of the disclosed technology enable a multifold acceleration of SoC hardware/firmware co-debugging since it allows reproducing prehistory of failure by running interfaces transactions that were collected on FPGA in the simulator with the reuse of verification tools that were used during block-level verification.

Acceleration is achieved owing to the following four factors: (1) reference model reuse for debugging; (2) the level of details available in the collected transaction log, which is sufficient in terms of both the number of stored signals and timeframe; (3) the possibility to distinguish between hardware and firmware bug in one scenario (transaction sequence) run; and (4) the possibility to reproduce the device under debug state in the simulation environment (as a reaction to the applied interfaces transactions) at any given moment.

The disclose embodiments can be of particular value during late SoC design validation stages when bugs have a complex nature and debugging takes a lot of efforts and time.

Figure 8:
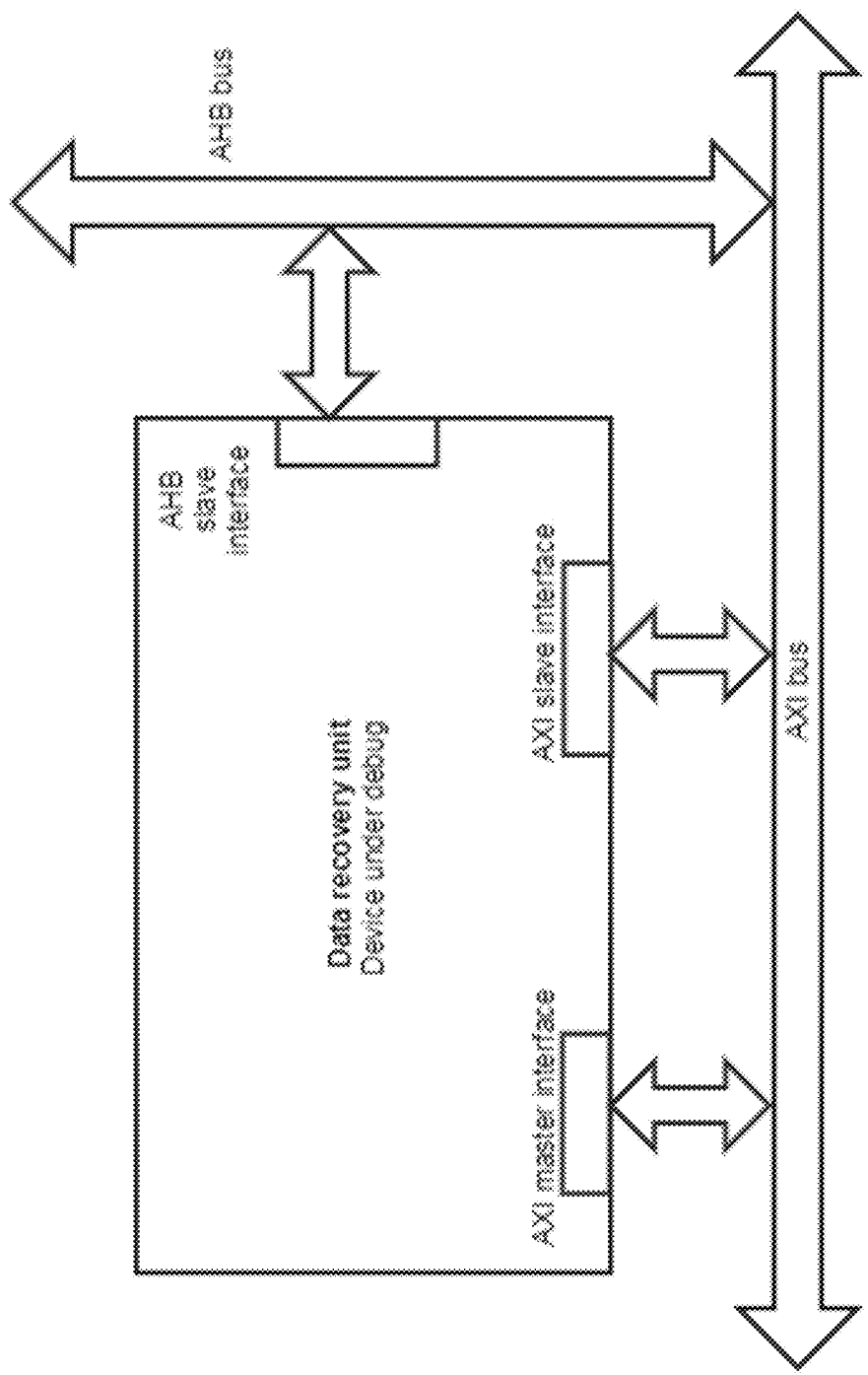
FIG. 8 illustrates an example interface of the data recovery unit based on some embodiments of the disclosed technology.
Figure 9:
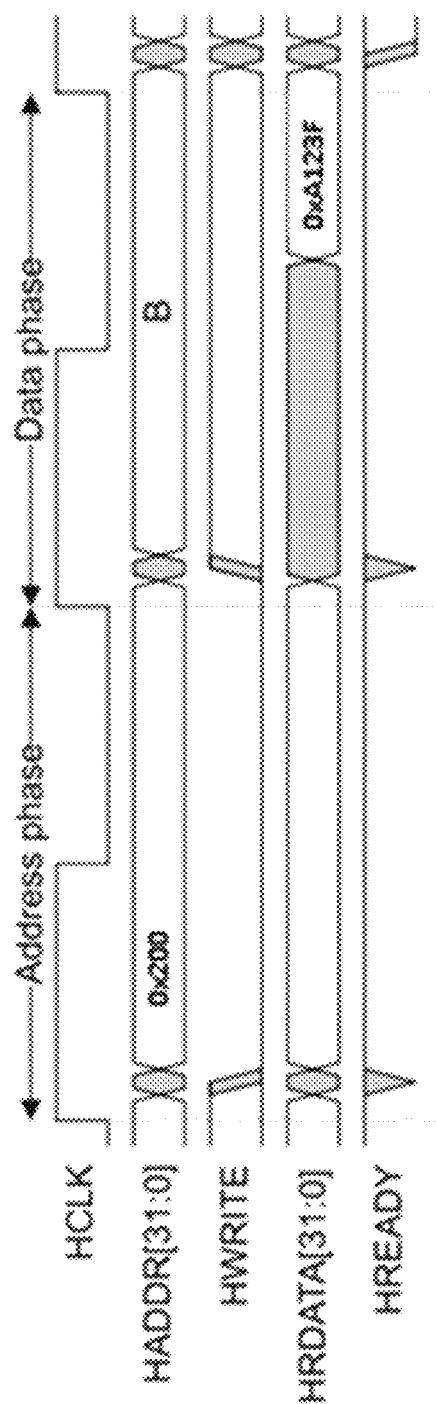
FIG. 9 illustrates an example of an advanced high-performance bus (AHB) protocol read transaction based on some embodiments of the disclosed technology.

FIG. 8 illustrates an example interface of the data recovery unit based on some embodiments of the disclosed technology. FIG. 9 illustrates an example of AHB protocol read transaction with the format described in Table 1.

In some embodiments of the disclosed technology, the device under debug (data recovery unit) includes an advanced extensible interface (AXI) slave interface, an AXI master interface, and an advanced high-performance bus (AHB) slave interface. In some implementations, the AHB may indicate a single channel bus, and the AXI may indicate a multi-channel bus. In some implementations, the AHB may indicate a shared bus whereas the AXI may indicate a read/write optimized bus.

As shown in FIG. 8, the AXI slave interface and the AXI master interface can be used for communications between the device under debug and the AXI bus, and the AHB slave interface can be used for communications between the device under debug and the AHB bus. In some implementations, the AXI master interface may be used for communications between the AXI bus and a CPU or microprocessor (not shown), and the AXI slave interface may be used for communications between the AXI bus and a memory (not shown) in communication with the CPU or microprocessor. The AHB slave interface may be used for communications between the AHB bus and a memory (e.g., external memory) in communication with the CPU or microprocessor.

In some embodiments of the disclosed technology, AHB protocol read transactions in the interface sniffer format is as follows:

TABLE 3

| Bytes QWORD | 15:12 | 11:8 | 7:4 | 3:0 |
| --- | --- | --- | --- | --- |
| 0 | 0x12 | 0x125f5 | | 0x5 |
| 1 | 0x0 | 0x4 | | 0x245 |
| 2 | 0x1 | 0x200 | | |
| 3 | 0xa123f | | | |
| 4 (CRC) | 0x245554fae4545a | | | |

In row Qword 0, "0x5" indicates a transaction type corresponding to AHB, "0x125f5" indicates a unique AHB transaction ID, and "0x12" indicates a sniffer ID that captured current transaction. In row Qword 1, "0x245" indicates a transaction start timestamp, and "0x4" indicates a read transaction transferred 4 bytes of data. In row Qword 2, "0x200" indicates a transaction read address, and "0x1" indicates a successfully completed read transaction. In row Qword 4, "0x245554fae4545a" indicates a CRC calculate on qwords 0, 1, 2 and 3.

The system implemented based on some embodiments of the disclosed technology may perform data encryption by several algorithms. In one example, the system may include an advanced encryption accelerator (AEA). The AEA supports several encryption algorithms. A default encryption algorithm is implemented in a hardware component of the AEA, and other encryption algorithms are software-implemented (handled by firmware). The hardware component includes a microprocessor capable of running firmware.

In some implementations, the AEA may be implemented as one of the hardware components in the system on chip. In some implementations, the AEA may be uses as an AXI 128-bit data width read and write master interface. The AEA reads data for encryption through AXI read channel interface. Read data is encrypted in the AEA and written to the corresponding memory location through an AXI 128-bit write channel. In some implementations, the AEA may be controlled and configured through AHB read/write slave interface. In some implementations, the AEA may be used with a microprocessor debug interface that is not monitored by interface sniffer. Firmware debug tool may be used to debug firmware execute on AEA microprocessor.

Figure 10:
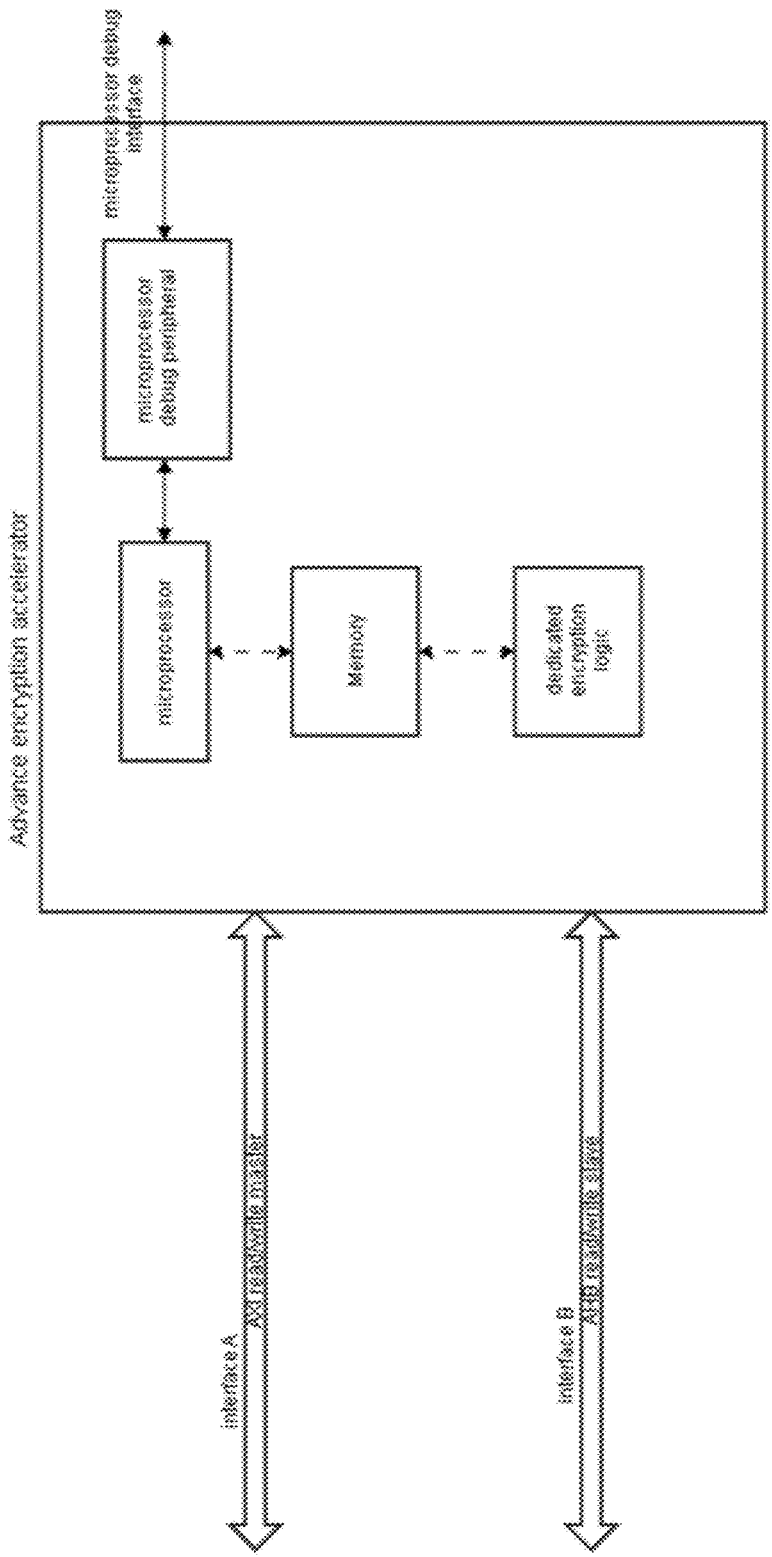
FIG. 10 illustrates an example of an advanced encryption accelerator (AEA).

FIG. 10 illustrates an example of an advanced encryption accelerator (AEA) block diagram. A critical data corruption occurred during system operation is routed to the AEA hardware component. In order to debug a system failure caused by the AEA, the AEA internal state prior to the failure and during the failure needs to be analyzed. In analyzing the internal states of the AEA, the computation system and method disclosed in this patent document can be applied.

In some implementations, the AEA may include a microprocessor, a memory in communication with the microprocessor, a dedicated encryption logic in communication with the memory, and a microprocessor debug peripheral circuit in communication with the microprocessor. As shown in FIG. 10, the AEA can be coupled to interfaces for communications with the AXI bus and the AHB bus. One interface may be an AXI read/write master interface for communications with the microprocessor and a memory device outside the AEA. Another interface may be an AHB read/write slave interface for communications between the memory and a processor outside the AEA.

Figure 11:
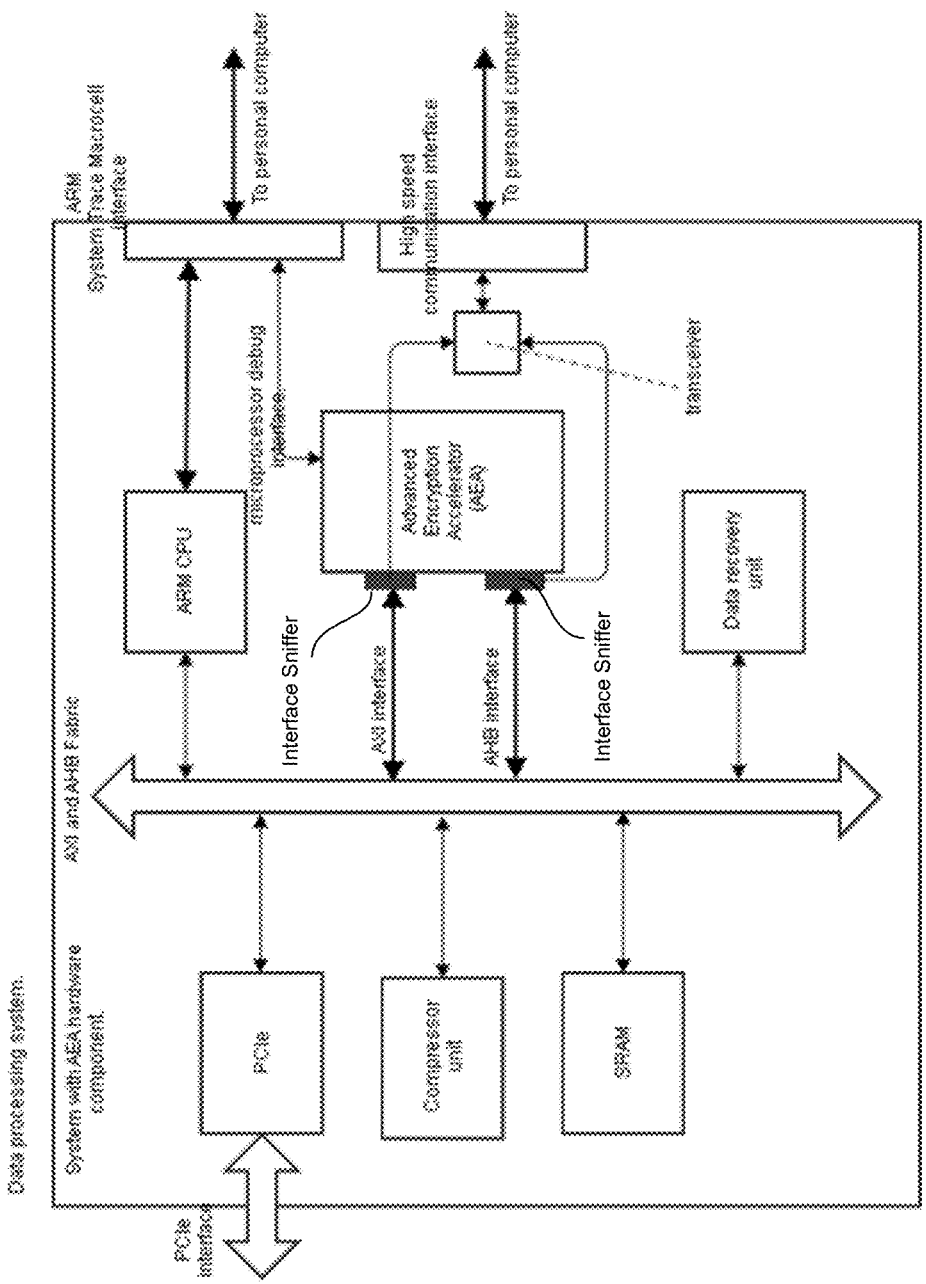
FIG. 11 illustrates an example of a system including hardware components based on some embodiments of the disclosed technology.

By using special software tools, interface sniffers, transceiver and data path connections may be generated and inserted into the original system design. In FIG. 11, a modified system with the interface sniffers, transceiver and updated data path connections is depicted. The transceiver and interface sniffers are coupled to the computer, the simulation environment and the reference model via the high-speed communication channel. In some implementations, the system may include a system trace macrocell. A system trace macrocell (STM) grants software developers the ability to instrument code utilizing a trace subsystem as a transport. All other hardware components of the system interact with the AEA and produce data on which the AEA operates.

FIG. 11 illustrates an example of a system including hardware components based on some embodiments of the disclosed technology.

As shown in FIG. 11, the AXI and AHB fabric provides the necessary infrastructure to connect to hardware components such as an interface (e.g., peripheral component interconnect express; PCIe), memory (e.g., SRAM), central processing unit (e.g., ARM CPU), data compressor unit, data recovery unit, and advanced encryption engine (security unit). As shown in FIG. 11, interface sniffers and the corresponding transceiver logic are created and instantiated using the interface sniffer generation software.

After recompilation of updated SoC design and programming it into FPGA, tests will be executed on the data processing system FPGA build. The advance encryption accelerator performs data processing as a part of the system operation flow. The input and output transactions are captured from the advance encryption accelerator interfaces and transferred to the computer for further analyses and processing.

As shown in FIG. 11, interface sniffers are attached to the interfaces. The interface sniffer signals change the tracking device. When an interface sniffer detects a transaction on the interface, it captures the transaction and forwards it to the computer for further processing. Interface sniffer is interface-specific device. For each interface type, a dedicated interface sniffer that supports corresponding interface protocol is used. For AXI bus, an interface sniffer that is capable to detect AXI bus transactions will be used. For AHB interface, interface sniffer supporting AHB protocol and capable to collect AHB transactions will be used.

Figure 12:
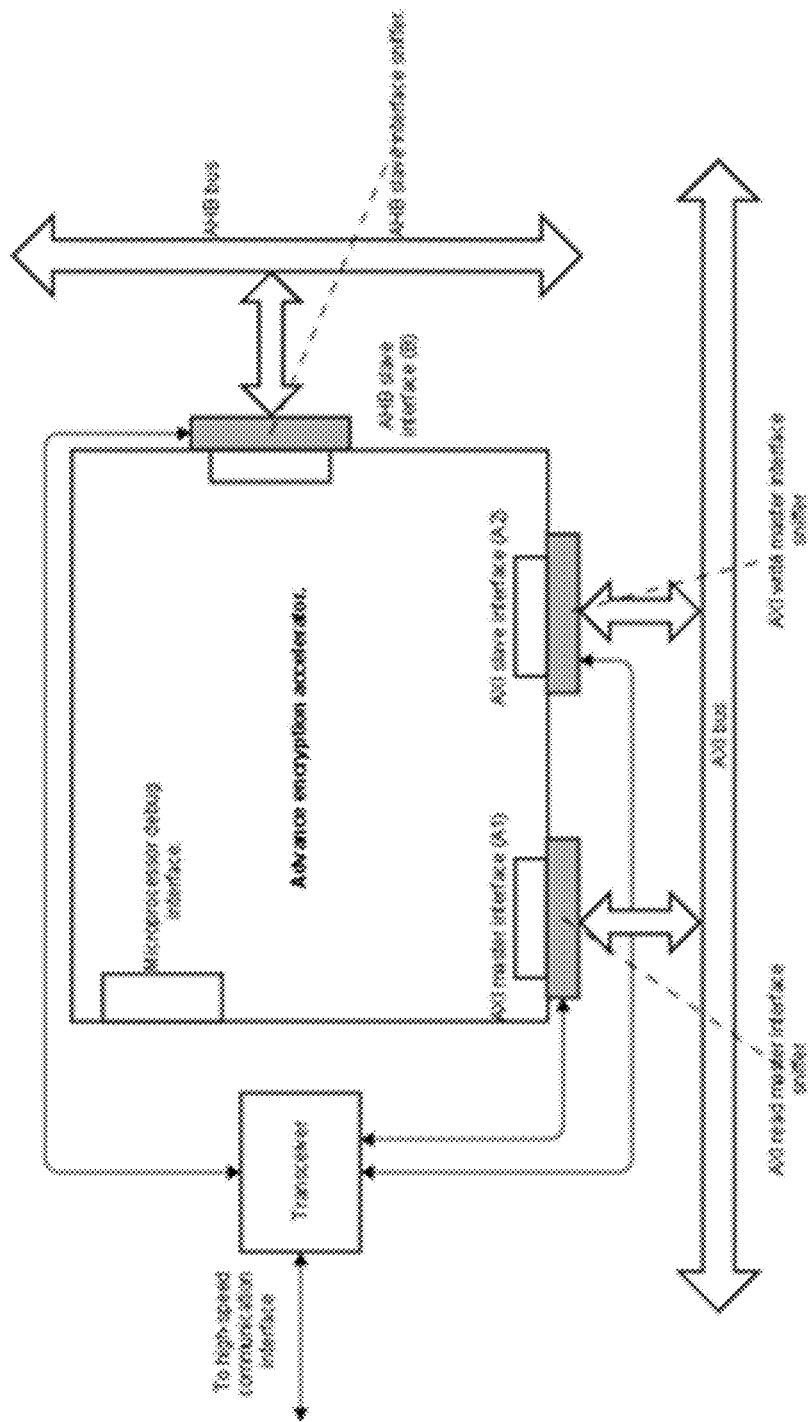
FIG. 12 illustrates examples of interface sniffers connected to advanced encryption accelerator (AEA) interfaces based on some embodiments of the disclosed technology.

FIG. 12 illustrates examples of interface sniffers connected to the interfaces between the advanced encryption accelerator (AEA) and the AXI bus and the interfaces between the AEA and the AHB bus based on some embodiments of the disclosed technology.

As shown in FIG. 12, the AXI slave interface and the AXI master interface can be used for communications between the AEA and the AXI bus, and the AHB slave interface can be used for communications between the AEA and the AHB bus. In some implementations, the AXI slave interface may be used for communications between the AXI bus and a microprocessor (not shown) in the AEA, and the AXI master interface may be used for communications between the AEA (e.g., a dedicated encryption logic in the AEA) and the AXI bus.

In some implementations, an AXI read slave interface sniffer can be coupled to the AXI slave interface to capture communications between a memory in the AEA and a processor in communication with the AEA to read data from the AEA via the AXI bus. In some implementations, an AXI write slave interface sniffer can be coupled to the AXI write slave interface to capture communications between a memory in the AEA and a processor in communication via the AXI bus with the AEA to write data into the memory in the AEA.

After recompilation, an updated system design is programmed into FPGA. Test stimulus will be applied on the system that is deployed on the FPGA prototyping board. The AEA hardware component performs data processing as a part of the system operation flow. The input and output transactions are captured from the AEA interfaces and transferred to the computer for further analysis and processing.

Figure 13:
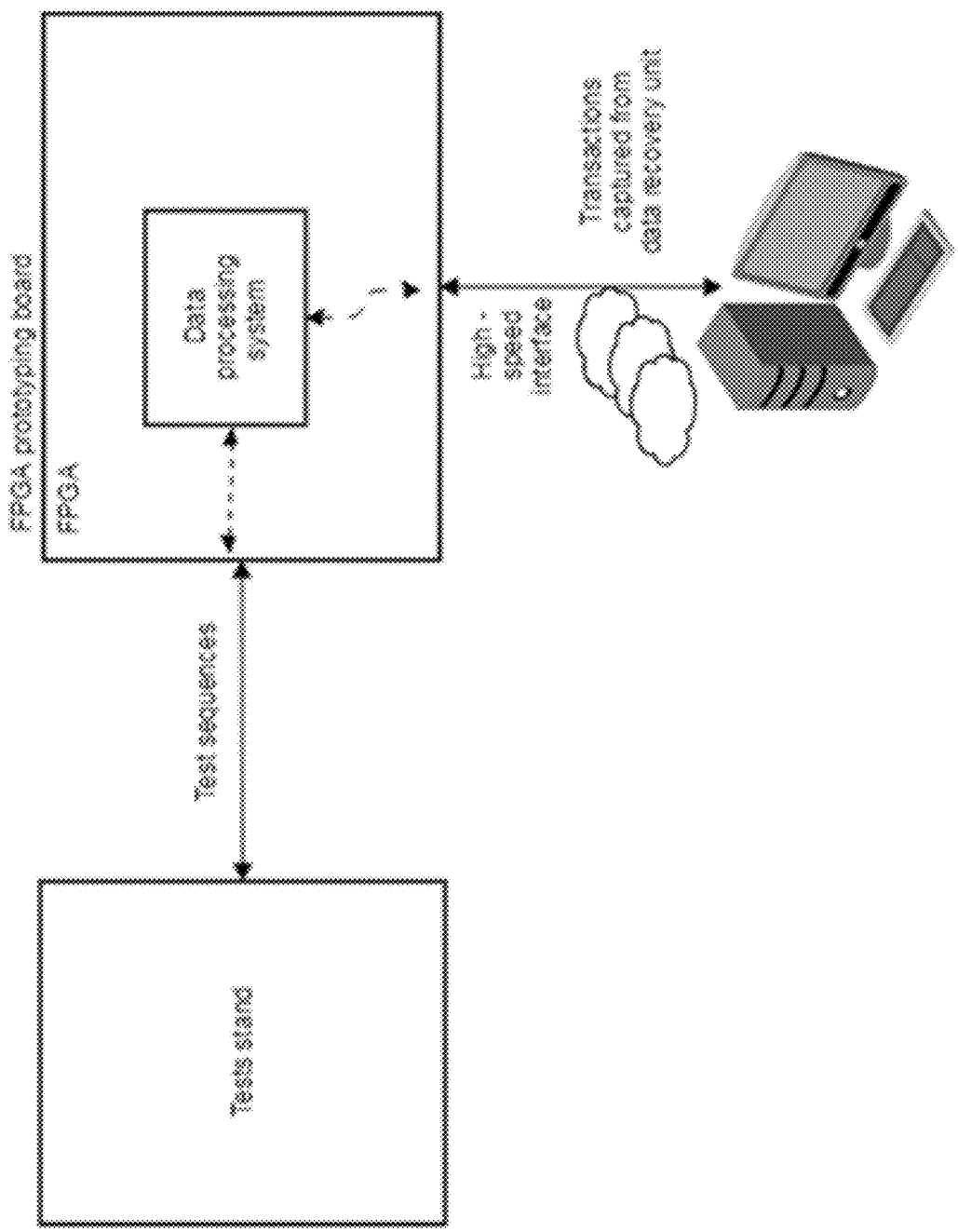
FIG. 13 illustrates an example of data-processing system test stand, FPGA board and computer system for capturing test sequences, data processing and transfer to the simulation environment based on some embodiments of the disclosed technology.

FIG. 13 illustrates an example of data-processing system test stand, FPGA board and computer system for capturing test sequences, data processing and transfer to the simulation environment based on some embodiments of the disclosed technology.

As shown in FIG. 13, test sequences are fed from a test stand to an FPGA prototyping board that includes a data processing system. In one example, the FPGA prototyping board includes integrated circuit modules that can be used to build reconfigurable digital circuits. In some embodiments of the disclosed technology, interface sniffers are attached to the modules to capture the internal transactions the FPGA prototyping board generates responsive to the test sequences. The FPGA prototyping board is connected to a computer that includes a reference model. The transactions fed to the reference model via a high-speed interface can change internal states of the reference model, and the changed internal states of the reference model can be used to reproduce internal states and expected outputs of hardware components that is being designed using the FPGA prototyping board.

On the computer, the received transaction is processed and passed to the HDL simulation environment. In the HDL simulation environment, the transaction is applied to the reference model of the advanced encryption accelerator.

Some embodiments of the disclosed technology can be implemented using the register-transfer level (RTL) model. From the applied transactions, a detailed internal state of the advanced encryption accelerator is reproduced in the HDL simulation environment. The HDL simulation environment provides a built-in functionality to record detailed internal HDL models signals. The firmware debug tool also provides detailed historical data of the executed code. The firmware debugger tool is synchronized with the HDL simulation environment by the method and apparatus capable to synchronize internal states of different simulation domains. After synchronization between different simulations domains has been completed, the engineer has at his/her disposal the device under debug internal signals changes history and firmware execution history. Having access to the detailed internal state of the device under debug and firmware execution history, the engineer can effectively debug the data processing unit and firmware.

Figure 14:
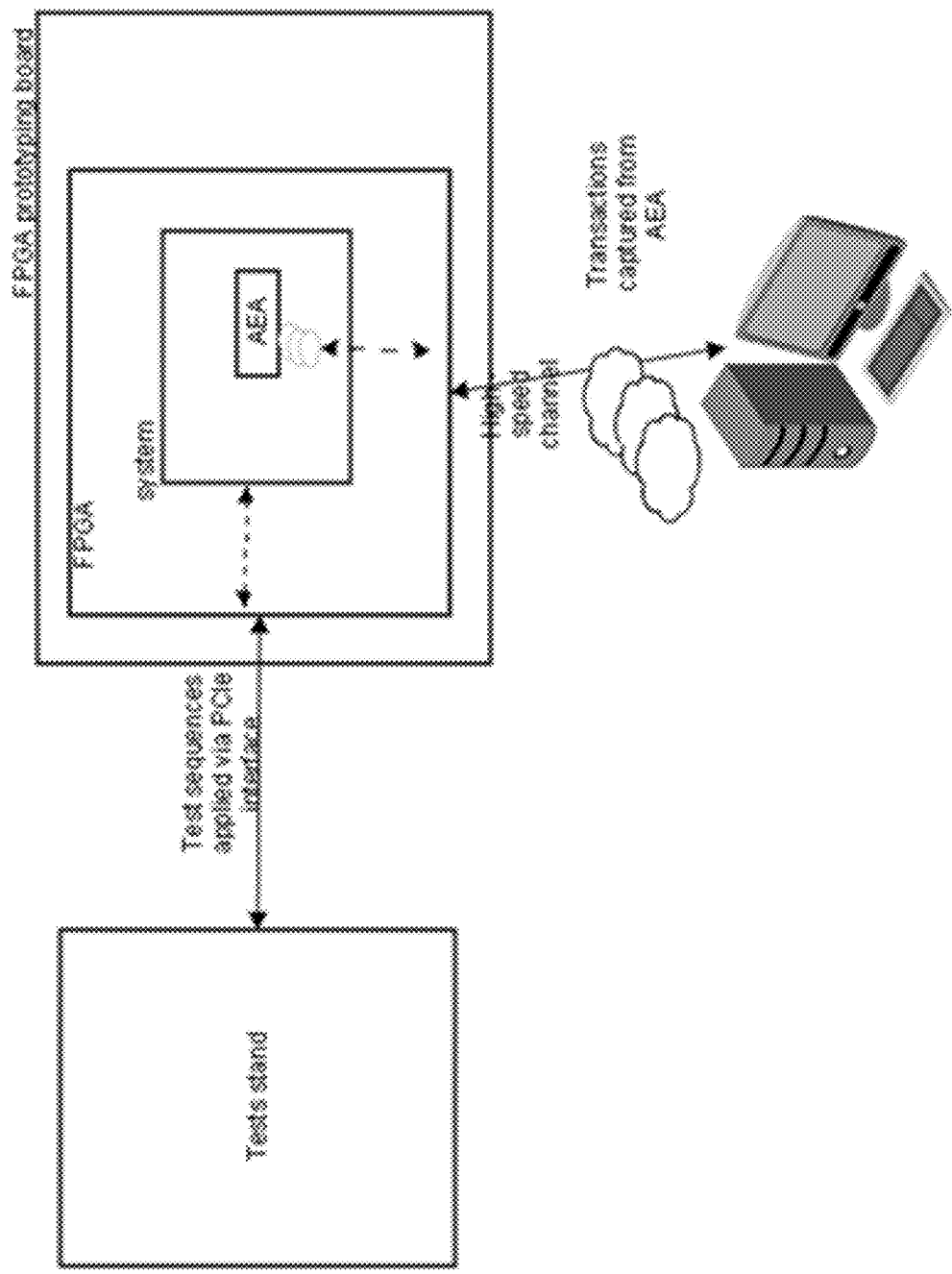
FIG. 14 illustrates a debug process flow for a system that includes the AEA.

FIG. 14 illustrates a debug process flow for a system that includes the AEA. The test stand runs tests as prior to interface sniffers insertion, and the transaction on AEA interfaces is coupled to simulation environment reference model. When data is corrupted by the AEA, the simulation environment will have a history regarding the changes in the AEA internal states and transaction logs.

From the applied transactions on the AEA reference model, a detailed internal state of the AEA is reproduced in the HDL simulation environment. The HDL simulation environment provides a built-in functionality to record detailed history of internal HDL models signals. The TRACE32 debug tool also provides detailed historical data of the AEA microproccesor executed instructions.

Figure 15:
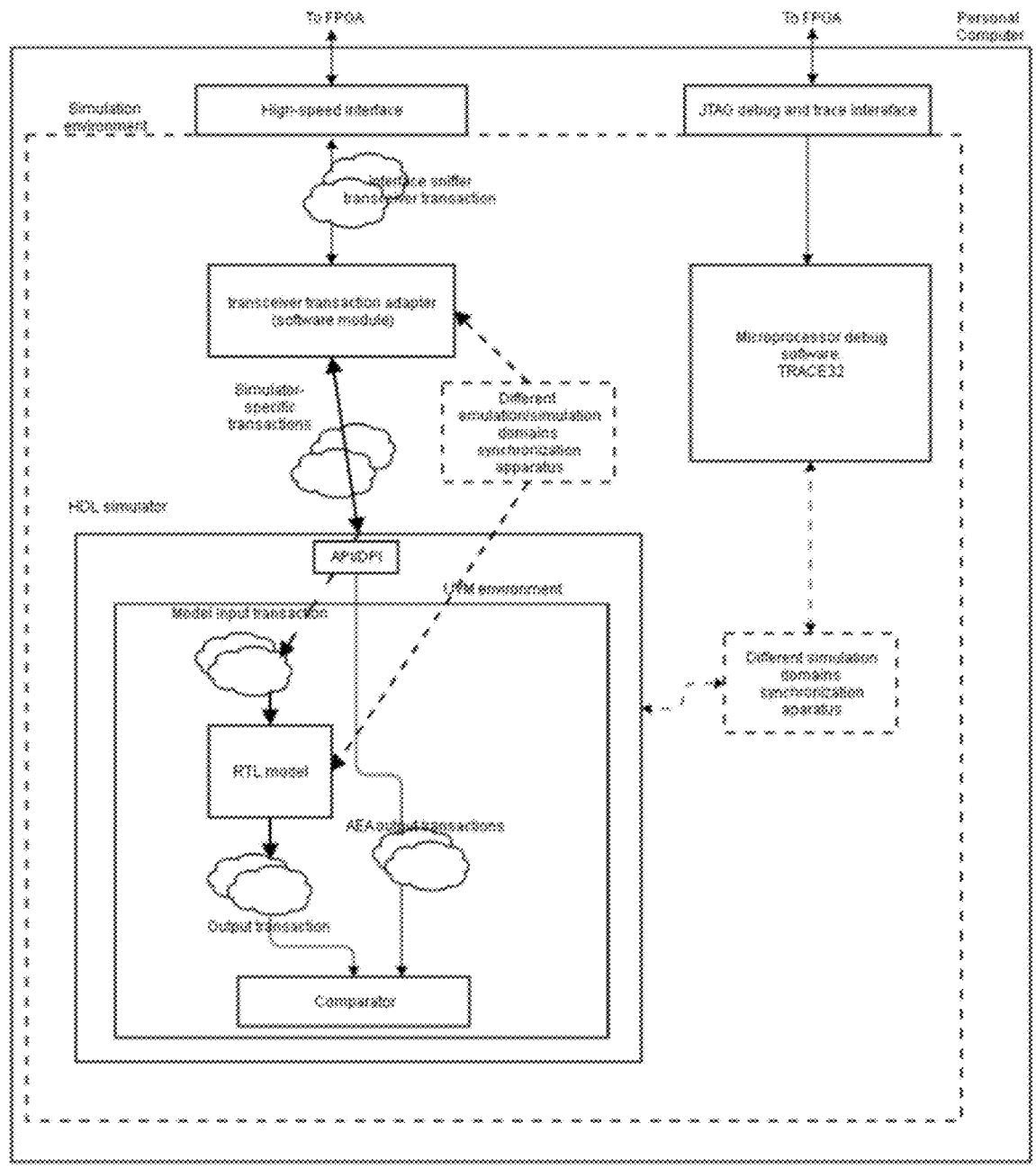
FIG. 15 illustrates another example component of computer system for debugging SoC hardware/firmware based on some embodiments of the disclosed technology.

FIG. 15 illustrates another example of computer system for debugging SoC hardware/firmware based on some embodiments of the disclosed technology.

In the computer, the transaction is received via the high-speed communication channel. For this purpose, in some implementations, PCIe x16 Gen 5 communication channel may be used.

After the computer receives the captured transactions, a transceiver transaction adapter converts them to a format supported by the HDL simulator. In some implementations, the received and simulator-specific transaction has the same format and it is described in Table 1 and Table 2. The transceiver transaction adapter invokes HDL simulator direct programming interface (DPI) functions and passes the converted transactions to HDL simulation environment. In the HDL simulation environment, the UVM environment is deployed. In HDL simulation environment, the received transaction is routed to the corresponding AXI and AHB UVM agents. The UVM agent converts one transaction to another transaction that is supported by RTL model. In the simulation environment, AEA RTL is used as a reference model, and therefore the received transactions are converted by UVM AXI and UVM AHB agents to signal-based transaction according to AXI and AHB protocol. In different simulation domains synchronization apparatus can synchronize the captured output transactions of the hardware component under debug with the corresponding output transactions produced by RTL model. Synchronization apparatus may adjust the timings such that a comparator receives output transactions in a correct order. The UVM comparator checks for transaction. In some implementations, the system may have microprocessor debug capability. In one example, a microprocessor development tool (e.g., TRACE32) can be used. The microprocessor development tool implemented based on some embodiments of the disclosed technology can provide a detailed history of executed microprocessor instructions, a comparison match/mismatch between AEA internal hardware components state, and AEA microprocessor programmable events. The microprocessor debug tool in conjunction with AEA internal state history and HDL simulator features provides a more extensive view on AEA internal states and significantly simplified AEA failure reproduction in the simulation environment and the debug process.

After synchronization between different simulation domains has been completed, a history of changes in the internal signals of the device under debug and firmware execution history can be used to effectively debug the advanced encryption accelerator and firmware.

Figure 16:
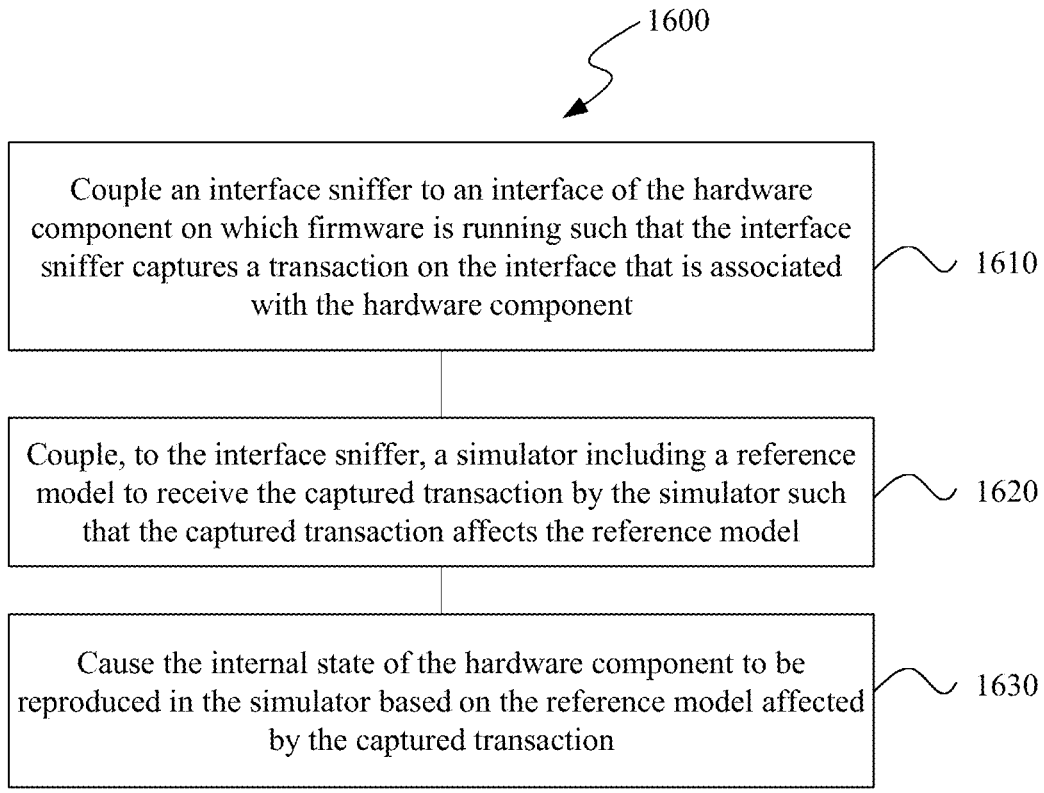
FIG. 16 is a flow diagram that illustrates an example of a debugging method based on some embodiments of the disclosed technology.

FIG. 16 is a flow diagram that illustrates an example of a debugging method 1600 based on some embodiments of the disclosed technology.

The method 1600 includes, at step 1610, coupling an interface sniffer to an interface of the hardware component on which firmware is running such that the interface sniffer captures a transaction on the interface that is associated with the hardware component.

The method 1600 includes, at step 1620, coupling, to the interface sniffer, a simulator including a reference model to receive the captured transaction by the simulator such that the captured transaction changes internal states of the reference model.

The method 1600 includes, at step 1630, causing the internal state of the hardware component to be reproduced in the simulator based on the internal states of the reference model changed by the captured transaction.

In some implementations, the method 1600 further includes synchronizing a firmware debugger with the simulator to debug the firmware. In some implementations, the simulator includes a hardware description language (HDL) simulator. In some implementations, the reference model includes at least one of a register-transfer level (RTL) model or a model used for block-level verification in a universal verification methodology (UVM) environment. In some implementations, the interface includes at least one of an advanced extensible interface (AXI) slave interface, an AXI master interface, or an advanced high-performance bus (AHB) slave interface. In some implementations, the hardware component includes an advanced encryption accelerator (AEA). In some implementations, coupling the interface sniffer to the interface includes instantiating and attaching components of the interface sniffer to the hardware using an interface sniffer generation software. In some implementations, the hardware includes system on chip (SoC) field programmable gate arrays (FPGA). In some implementations, the method 1600 further includes performing data processing with updated SoC and capturing input and output transactions from the interface.

Figure 17:
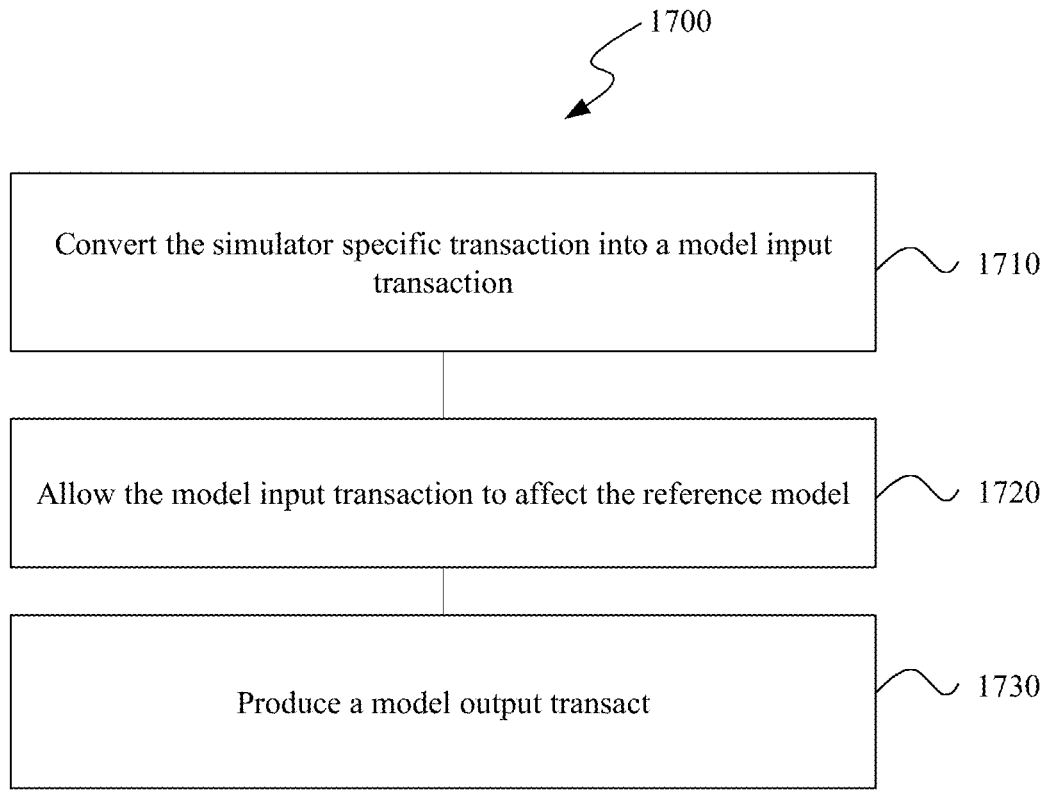
FIG. 17 is a flow diagram that illustrates another example of the debugging method based on some embodiments of the disclosed technology.

FIG. 17 is a flow diagram that illustrates another example of the debugging method based on some embodiments of the disclosed technology.

The method 1700 includes, at step 1710, converting the simulator specific transaction into a model input transaction.

The method 1700 includes, at step 1720, allowing the model input transaction to affect the reference model.

The method 1700 includes, at step 1730, producing a model output transaction.

Implementations of the subject matter and the functional operations described in this patent document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "processor" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of nonvolatile memory, media and memory devices, including by way of example semiconductor memory devices, e.g., EPROM, EEPROM, and flash memory devices. The processor and the memory can be supplemented by, or incorporated in, special purpose logic circuitry.

While operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A method for reproducing an output transaction of a hardware component responsive to an input in a simulation environment, the method comprising:
    coupling an interface sniffer to an interface of the hardware component on which firmware is running such that the interface sniffer captures in real time an input transaction on the interface that is associated with the hardware component;
    coupling, to the interface sniffer, a simulator including a reference model to receive the captured input transaction by the simulator such that the captured input transaction changes internal states of the reference model;
    causing the internal state of the hardware component to be reproduced in the simulator based on the internal states of the reference model changed by the captured input transaction to produce a model output transaction of the reference model responsive to the captured input transaction as an expected output transaction of the hardware component capturing, by the interface sniffer, an output transaction of a hardware component responsive to the input transaction; and
    comparing the captured output transaction of the hardware component to the model output transaction of the reference model to determine whether there is a mismatch between the captured output transaction of the hardware component and the model output transaction of the reference model.

2. The method of claim 1, wherein the transaction includes an electrical or a radio signal used for a communication with the hardware component.

3. The method of claim 1, further comprising adding, to a design of the hardware component, a logic circuit corresponding to the reproduced internal state of the hardware component.

4. The method of claim 1, further comprising:
    synchronizing a firmware debugger with the simulator to debug the firmware.

5. The method of claim 1, wherein the simulator includes a hardware description language (HDL) simulator.

6. The method of claim 1, wherein the reference model includes at least one of a register-transfer level (RTL) model or a model used for block-level verification in a universal verification methodology (UVM) environment.

7. The method of claim 1, wherein coupling the interface sniffer to the interface includes instantiating and attaching components of the interface sniffer to the hardware component using an interface sniffer generation software.

8. The method of claim 1, wherein the hardware component is part of a system on chip (SoC).

9. The method of claim 8, further comprising:
modifying an original design of the system on chip with a logic to capture hardware component interface transactions; and
compiling and uploading the modified design of the hardware component to a dedicated field programmable gate array (FPGA).

10. The method of claim 9, further comprising performing data processing on the modified system on chip and capturing input and output transactions from the hardware component interface.

11. The method of claim 1, further comprising synchronizing the input transaction of the hardware component, the output transaction of the hardware component output transactions, and the model output transaction of the reference model.

12. A system comprising:
an interface sniffer in communication with an interface of a hardware component to capture an input transaction and an output transaction responsive to the input transaction on the interface that is associated with a hardware component;
a processor in communication with the interface sniffer to produce a simulator specific transaction based on the captured input transaction;
a simulator including a reference model in communication with the processor and configured to:
convert the simulator specific transaction into a model input transaction;
allow the model input transaction to affect the reference model; and
produce a model output transaction; and
a comparator configured to compare the captured output transaction to the model output transaction to determine whether there is a mismatch between the captured output transaction and the model output transaction.

13. The system of claim 12, further comprising:
a synchronizer configured to synchronize a firmware debugger with the simulator to debug the firmware.

14. The system of claim 12, wherein the simulator includes a hardware description language (HDL) simulator.

15. The system of claim 12, wherein the reference model includes at least one of a register-transfer level (RTL) model or a model used for block-level verification in a universal verification methodology (UVM) environment.

16. The system of claim 12, wherein the hardware component is an element of a system on chip (SoC) that has been programmed in field programmable gate arrays (FPGA).

17. The system of claim 12, further comprising a synchronization apparatus coupled to the interface sniffer and the simulator to synchronize the input transaction, the output transaction, and the model output transaction.

18. A method for reproducing output transactions of a hardware component responsive to input transactions in a simulations environment, the method comprising:
coupling a plurality of interface sniffers to a plurality of interfaces of the hardware component on which firmware is running such that the interface sniffer captures in real time a plurality of input transactions on the plurality of interfaces associated with the hardware component;
coupling, to the plurality of interface sniffers, a simulator including a reference model to receive the plurality of captured input transactions by the simulator such that the plurality of captured input transactions changes internal states of the reference model;
synchronizing the plurality of interface sniffers coupled to the plurality of interfaces of the hardware component;
causing the internal state of the hardware component to be reproduced in the simulator based on the internal states of the reference model changed by the plurality of captured input transactions to produce a plurality of model output transactions of the reference model responsive to the plurality of captured input transactions as a plurality of expected output transactions of the hardware component;
capturing, by the plurality of interface sniffers, a plurality of output transactions of a hardware component responsive to the plurality of input transactions;
comparing the plurality of captured output transactions of the hardware component to the plurality of model output transactions of the reference model, respectively, to determine whether there is a mismatch between the plurality of captured output transactions of the hardware component and the plurality of model output transactions of the reference model.

19. The method of claim 18, wherein the simulator includes a hardware description language (HDL) simulator.

20. The method of claim 18, wherein the reference model includes at least one of a register-transfer level (RTL) model or a model used for block-level verification in a universal verification methodology (UVM) environment.

* * * * *